United States Patent
Browning et al.

(10) Patent No.: US 9,420,713 B2
(45) Date of Patent: Aug. 16, 2016

(54) DOUBLE ANODIZING PROCESSES

(75) Inventors: Lucy Elizabeth Browning, San Francisco, CA (US); Charles B. Woodhull, San Francisco, CA (US); Bryan Patrick Kiple, Los Gatos, CA (US); David A. Pakula, San Francisco, CA (US); Tang Yew Tan, San Francisco, CA (US); Julie Hanchak-Connors, San Francisco, CA (US); John Murray Thornton, III, Los Gatos, CA (US); Thomas Johannessen, Fjerdingby (NO); Peter Russell-Clarke, San Francisco, CA (US); Masashige Tatebe, Kakogawa (JP); Napthaneal Y. Tan, San Jose, CA (US)

(73) Assignee: Apple Inc., Cupertino, CA (US)

( * ) Notice: Subject to any disclaimer, the term of this patent is extended or adjusted under 35 U.S.C. 154(b) by 677 days.

(21) Appl. No.: 13/610,813

(22) Filed: Sep. 11, 2012

(65) Prior Publication Data
US 2013/0319865 A1  Dec. 5, 2013

Related U.S. Application Data

(60) Provisional application No. 61/689,170, filed on May 29, 2012.

(51) Int. Cl.
C25D 11/02 (2006.01)
H05K 5/04 (2006.01)
(Continued)

(52) U.S. Cl.
CPC .. *H05K 5/04* (2013.01); *B23C 5/00* (2013.01); *B23C 5/1081* (2013.01); *B23P 11/00* (2013.01); *B23P 17/00* (2013.01); *B23P 17/02* (2013.01); *C25D 7/00* (2013.01); *C25D 11/02* (2013.01);
(Continued)

(58) Field of Classification Search
None
See application file for complete search history.

(56) References Cited

U.S. PATENT DOCUMENTS 1,817,310 A  8/1931  Hauch
2,691,627 A  10/1954  Johnson
(Continued)

FOREIGN PATENT DOCUMENTS

EP  0532229  3/1993
JP  S58123899 A  7/1983
(Continued)

OTHER PUBLICATIONS

PCT Application No. PCT/US2013/042892—International Search Report and Written Opinion dated Nov. 11, 2013.
(Continued)

*Primary Examiner* — Vera Katz
(74) *Attorney, Agent, or Firm* — Downey Brand LLP

(57) ABSTRACT

Methods and structures for forming anodization layers that protect and cosmetically enhance metal surfaces are described. In some embodiments, methods involve forming an anodization layer on an underlying metal that permits an underlying metal surface to be viewable. In some embodiments, methods involve forming a first anodization layer and an adjacent second anodization layer on an angled surface, the interface between the two anodization layers being regular and uniform. Described are photomasking techniques and tools for providing sharply defined corners on anodized and texturized patterns on metal surfaces. Also described are techniques and tools for providing anodizing resistant components in the manufacture of electronic devices.

13 Claims, 21 Drawing Sheets

(51) Int. Cl.
| | |
|---|---|
| *B23P 11/00* | (2006.01) |
| *B23P 17/00* | (2006.01) |
| *G03F 1/38* | (2012.01) |
| *H01Q 1/24* | (2006.01) |
| *H04M 1/02* | (2006.01) |
| *H05K 5/02* | (2006.01) |
| *H05K 13/00* | (2006.01) |
| *C25D 7/00* | (2006.01) |
| *C25D 11/12* | (2006.01) |
| *H05K 5/03* | (2006.01) |
| *H01Q 1/42* | (2006.01) |
| *C25D 11/34* | (2006.01) |
| *B23C 5/10* | (2006.01) |
| *B23C 5/00* | (2006.01) |
| *B23P 17/02* | (2006.01) |
| *H04M 1/11* | (2006.01) |
| *C25D 11/24* | (2006.01) |

(52) U.S. Cl.
CPC ............ *C25D 11/022* (2013.01); *C25D 11/12* (2013.01); *C25D 11/34* (2013.01); *G03F 1/38* (2013.01); *H01Q 1/243* (2013.01); *H01Q 1/42* (2013.01); *H04M 1/0254* (2013.01); *H04M 1/11* (2013.01); *H05K 5/02* (2013.01); *H05K 5/0217* (2013.01); *H05K 5/0247* (2013.01); *H05K 5/03* (2013.01); *H05K 13/00* (2013.01); *B23C 2220/04* (2013.01); *B23C 2220/16* (2013.01); *B23C 2220/20* (2013.01); *B23C 2220/28* (2013.01); *B23C 2220/48* (2013.01); *B23C 2226/31* (2013.01); *B23C 2226/315* (2013.01); *C25D 11/246* (2013.01); *H04M 1/0249* (2013.01); *Y10T 29/47* (2015.01); *Y10T 29/49002* (2015.01); *Y10T 29/49826* (2015.01); *Y10T 156/10* (2015.01); *Y10T 156/1064* (2015.01); *Y10T 407/1906* (2015.01); *Y10T 409/300896* (2015.01); *Y10T 409/30952* (2015.01); *Y10T 409/303752* (2015.01)

(56) References Cited

U.S. PATENT DOCUMENTS

| | | |
|---|---|---|
| 3,367,852 A | 2/1968 | McGivern, Jr. |
| 3,450,606 A | 6/1969 | Darrow |
| 4,606,796 A | 8/1986 | Hanazima et al. |
| 4,662,801 A | 5/1987 | Kondou et al. |
| 4,902,580 A | 2/1990 | Gillery |
| 4,939,316 A | 7/1990 | Mahulikar et al. |
| 4,993,891 A | 2/1991 | Kaminiski et al. |
| 5,022,797 A | 6/1991 | Sawa et al. |
| 5,049,011 A | 9/1991 | Bohnet et al. |
| 5,185,956 A | 2/1993 | Steere, Jr. |
| 5,463,503 A | 10/1995 | Kawada et al. |
| 5,655,860 A | 8/1997 | Oles |
| 6,342,145 B1 | 1/2002 | Houssian et al. |
| 6,355,334 B1 | 3/2002 | Rondeau et al. |
| 6,440,334 B2 | 8/2002 | Currens et al. |
| 6,620,735 B2 | 9/2003 | Pinter et al. |
| 6,663,246 B2 | 12/2003 | Currens et al. |
| 6,802,952 B2 | 10/2004 | Hsu |
| 6,821,051 B2 | 11/2004 | Attar |
| 6,936,349 B2 | 8/2005 | Naganuma et al. |
| 6,942,433 B2 | 9/2005 | Schleinkofer et al. |
| 7,044,697 B2 | 5/2006 | Kodaka et al. |
| 7,125,205 B2 | 10/2006 | Sheffler |
| 7,134,811 B2 | 11/2006 | Francis et al. |
| 7,140,812 B2 | 11/2006 | Bryan et al. |
| 7,166,205 B2 | 1/2007 | Kuo et al. |
| 7,347,924 B1 | 3/2008 | Yoon |
| 7,431,541 B2 | 10/2008 | Chang |
| 7,442,588 B2 | 10/2008 | Jang et al. |
| 7,625,161 B1 | 12/2009 | Ruy Frota de Souza |
| 7,765,902 B2 | 8/2010 | Kuroda et al. |
| 7,911,771 B2 | 3/2011 | DiFonzo et al. |
| 7,982,837 B2 | 7/2011 | Kawasaki |
| 8,123,967 B2 | 2/2012 | Anton et al. |
| 8,742,997 B2 | 6/2014 | Nickel et al. |
| 8,791,864 B2 | 7/2014 | Merz et al. |
| 8,836,587 B2 | 9/2014 | Darnell et al. |
| 8,913,395 B2 | 12/2014 | Myers et al. |
| 8,933,347 B2 | 1/2015 | Kiple et al. |
| 9,007,748 B2 | 4/2015 | Jarvis |
| 9,061,358 B2 | 6/2015 | Tan et al. |
| 9,098,237 B2 | 8/2015 | Jarvis |
| 9,114,487 B2 | 8/2015 | Kiple et al. |
| 2004/0050710 A1 | 3/2004 | Yan |
| 2007/0026205 A1 | 2/2007 | Anton et al. |
| 2007/0031201 A1 | 2/2007 | Maeda |
| 2007/0089574 A1 | 4/2007 | Murakami et al. |
| 2007/0280792 A1 | 12/2007 | Kochan et al. |
| 2009/0060662 A1 | 3/2009 | Maurer |
| 2009/0116913 A1 | 5/2009 | Xiao et al. |
| 2009/0205983 A1* | 8/2009 | Estlander ..................... 206/305 |
| 2009/0234490 A1 | 9/2009 | Suprock et al. |
| 2010/0006145 A1 | 1/2010 | Lee |
| 2010/0018092 A1 | 1/2010 | Peckham |
| 2011/0017602 A1 | 1/2011 | Khosla |
| 2011/0089039 A1 | 4/2011 | Nashner |
| 2011/0186325 A1 | 8/2011 | Myers et al. |
| 2011/0188178 A1 | 8/2011 | Myers et al. |
| 2011/0250377 A1 | 10/2011 | Qin |
| 2011/0297578 A1 | 12/2011 | Stiehl et al. |
| 2012/0076573 A1 | 3/2012 | Pilliod et al. |
| 2013/0319865 A1 | 12/2013 | Browning et al. |
| 2013/0319866 A1 | 12/2013 | Browning et al. |
| 2013/0319873 A1 | 12/2013 | Browning et al. |
| 2013/0322975 A1 | 12/2013 | Tan et al. |
| 2014/0069245 A1 | 3/2014 | Tan et al. |
| 2015/0196981 A1 | 7/2015 | Tan et al. |
| 2015/0351273 A1 | 12/2015 | Kiple et al. |

FOREIGN PATENT DOCUMENTS

| | | |
|---|---|---|
| JP | 2003160898 A | 6/2003 |
| JP | 2006-083451 | 3/2006 |
| KR | 1020040096045 A | 11/2004 |
| KR | 10-0575299 | 4/2006 |
| KR | 100914858 B1 | 9/2009 |
| WO | 0238334 | 5/2002 |

OTHER PUBLICATIONS

U.S. Appl. No. 13/332,288, filed Dec. 20, 2011.
PCT Application No. PCT/US2013/042911—International Search Report and Written Opinion dated Sep. 4, 2013.
Anodic Coatings for Aluminum and Aluminum Alloys, Military Specification MIL-A-8625F, dated Sep. 10, 1993.
Korean Patent Application No. 10-2014-7036618—Notice of Preliminary Rejection dated Mar. 10, 2016.

* cited by examiner

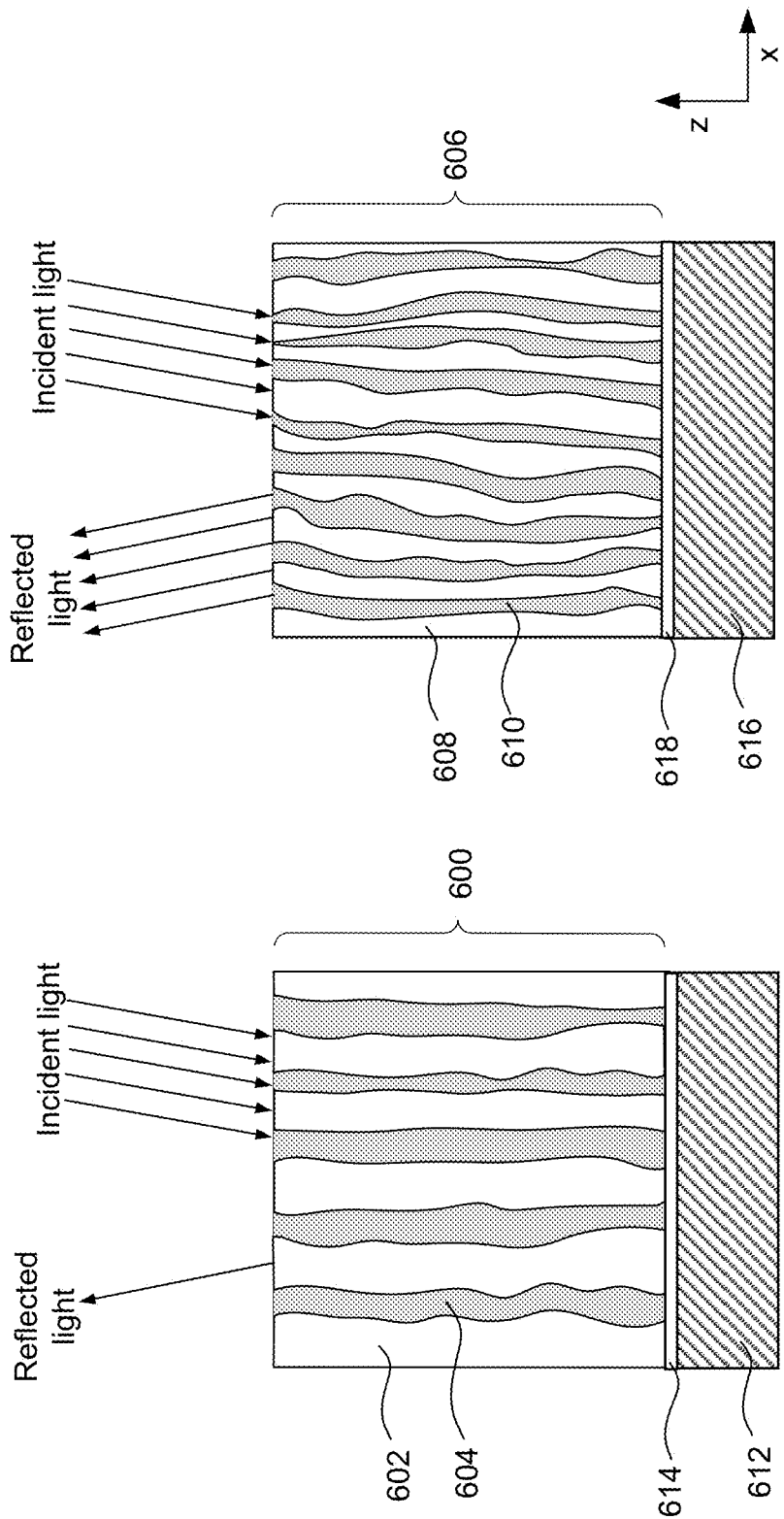

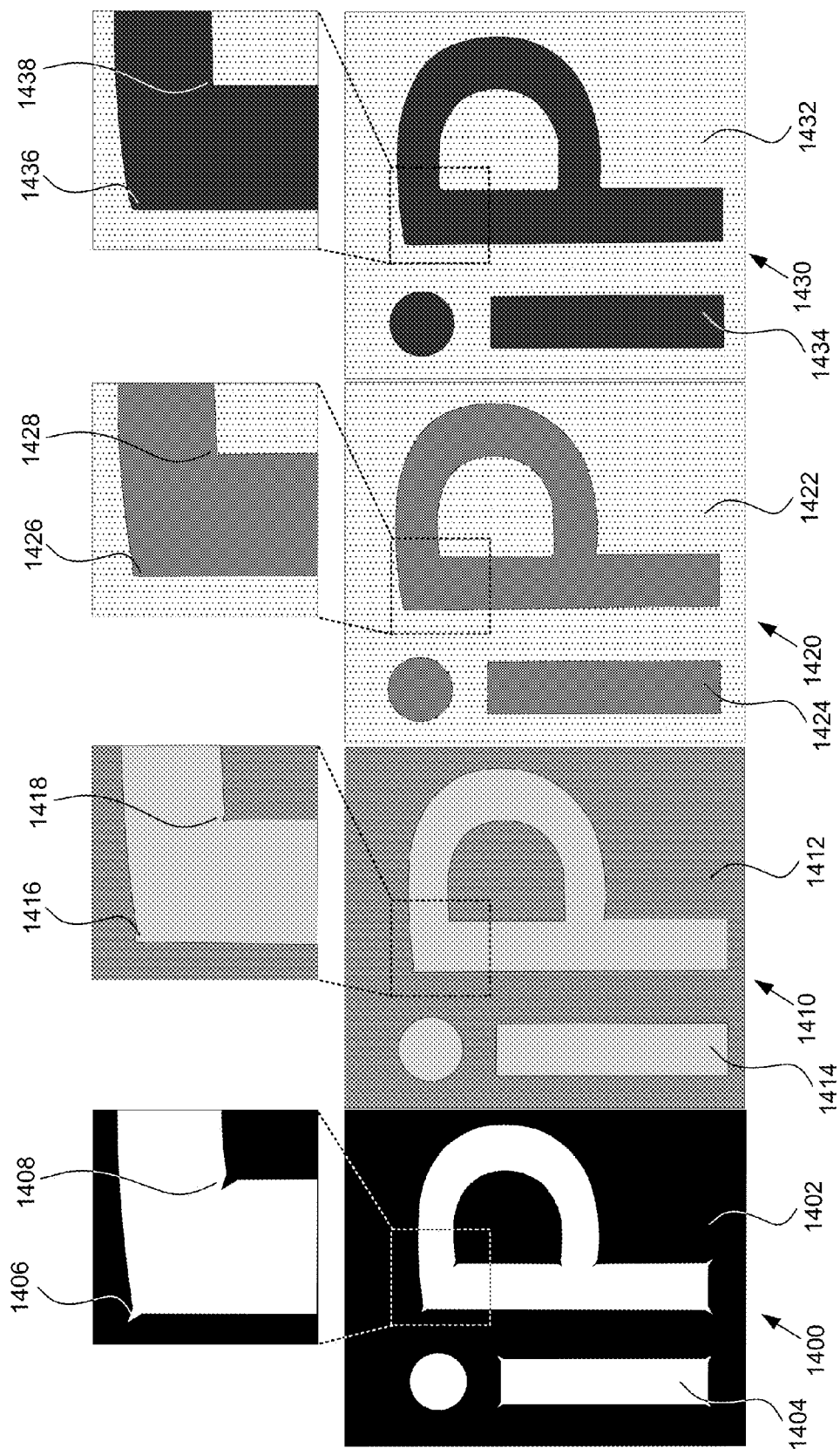

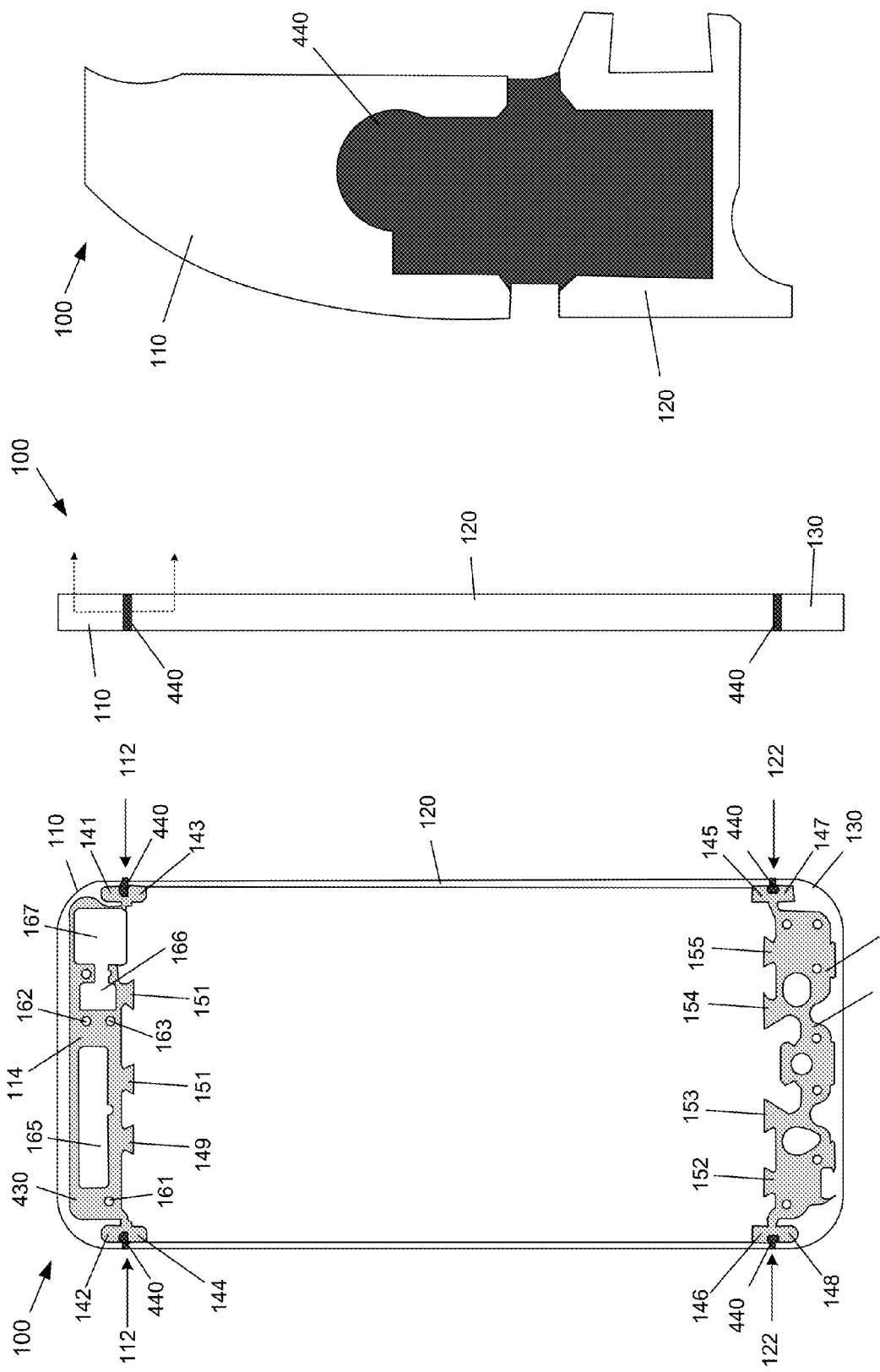

DOUBLE ANODIZING PROCESSES

CROSS REFERENCE TO RELATED APPLICATIONS

This application claims priority under 35 U.S.C. §119(e) to U.S. Provisional Patent Application No. 61/689,170, filed May 29, 2012, and entitled "COMPONENT FOR AN ELECTRONIC DEVICE," which is incorporated herein by reference in its entirety and for all purposes.

FIELD OF THE DESCRIBED EMBODIMENTS

The described embodiments relate generally to anodizing processes. More specifically, embodiments describe methods for producing anodization layers that can protect and enhance the appearance of metal surfaces. Tools and methods for accommodating anodizing processes performed on enclosures for electronic devices are described.

BACKGROUND

Consumer products such as personal computers and electronic devices often have metal surfaces. During the manufacture of the consumer products, these metal surfaces typically undergo a number of operations in order to make the metal parts functional as well as cosmetically appealing. For instance, the metal housing of a consumer product can undergo machining operations to form features in the metal and design operations to form patterns and logos on the metal surfaces.

In addition, metal surfaces are usually treated so as to be more wear and corrosion resistant. For example, aluminum surfaces are typically anodized to convert part of the aluminum to aluminum oxide. Aluminum oxide films are harder than aluminum, thereby providing a protective layer over the softer aluminum. Consumer products such as electronic devices tend to have sharp corners and edges that make it difficult to form a consistent and cosmetically appealing anodization film thereon.

SUMMARY

This paper describes various embodiments that relate to methods and tools for producing anodization films. Methods described are useful for providing protective anodization films on metal surfaces of electronic devices such as enclosures for mobile telephones and the like. The anodization films can not only protect, but can also cosmetically enhance the look and feel of metal surfaces of electronic devices.

According to one embodiment, a method of forming a protective layer on a metal housing is described. The metal housing has an exterior surface with a first surface having a first surface orientation vector and a second surface having a second surface orientation vector. The first and second surfaces are contiguous with each other and the first and second surface vectors are non-parallel. The method involves using a first anodization process to grow a primary anodization layer on a selected portion of the exterior surface of the housing that includes both the first and the second surfaces. The method also involves removing a contiguous portion of the primary anodization layer and a corresponding pre-determined amount of the underlying metal housing to form a chamfered assembly. The chamfered assembly includes a third surface having a third surface orientation vector and being contiguous with and disposed between remaining portions of the first and second surfaces. The method also involves using a second anodization process to grow a secondary anodization layer on the third surface in accordance with the third surface orientation vector. The secondary anodization layer includes a first edge adjacent to the remaining portion of the first surface and second edge adjacent to the remaining portion of the second surface. The first and second edges align with the third surface orientation vector such that a first angle between the first edge and the remaining portion of the first surface and a second angle between the second edge and the remaining portion of the second surface are about equal.

According to another embodiment, a method for forming a highlighted boundary between a primary anodization layer overlaying a first portion of a metal surface and a secondary anodization layer overlaying a second portion of the metal surface is described. The first and second portions are contiguous with each other. The method involves using a patterned layer of photoresist to mask the second portion of the metal surface. The method also involves texturing the exposed first portion of the metal surface. The method additionally involves causing an edge of the patterned layer of photoresist adjacent to the textured first portion of the metal surface to lift from the underlying second portion of the metal surface to reveal an exposed second portion of the metal surface. The method further involves using a first anodization process to form the primary anodization layer on the first portion of the metal and a boundary anodization layer at the exposed second portion of the metal surface. The method also involves removing the patterned layer of photoresist. The method additionally involves using a second anodization process to form the secondary anodization layer on the exposed second portion of the metal surface, wherein the boundary anodization layer defines and highlights the secondary anodization layer.

According to an additional embodiment, a consumer electronic product is described. The consumer electronic produce includes a single piece metal housing having a front opening surrounded and defined by a top portion. The single piece housing further includes a bottom portion and a side wall that cooperate with the top portion to form a cavity in cooperation with the front opening. A chamfered portion is disposed between the top portion and the side wall. The single piece housing also includes a protective anodization layer on a surface of the single piece housing. The protective anodization layer has a primary anodization layer. The primary anodization layer is disposed on the bottom portion, the side wall and the top portion of the single piece housing. The single piece housing also includes a secondary anodization layer disposed on the chamfered portion of the single piece housing. The secondary anodization layer has different properties than the primary anodization layer. A well defined boundary separates the primary anodization layer and the secondary anodization layer.

BRIEF DESCRIPTION OF THE DRAWINGS

FIGS. 6A and 6B graphically illustrate the microstructures of selected profiles of two different anodization layers produced by two different anodizing processes.

FIGS. 14A-14D graphically illustrate selected portions of a photomask, photoresist and substrate using a photomask in accordance with described embodiments.

FIGS. 15A-15B illustrate views of an enclosure for an electronic device having anodizing resistant plastic coupling members in accordance with described embodiments.

FIG. 16 illustrates a close up view of a portion of FIG. 15B in accordance with described embodiments.

DETAILED DESCRIPTION OF SELECTED EMBODIMENTS

Figure 1:
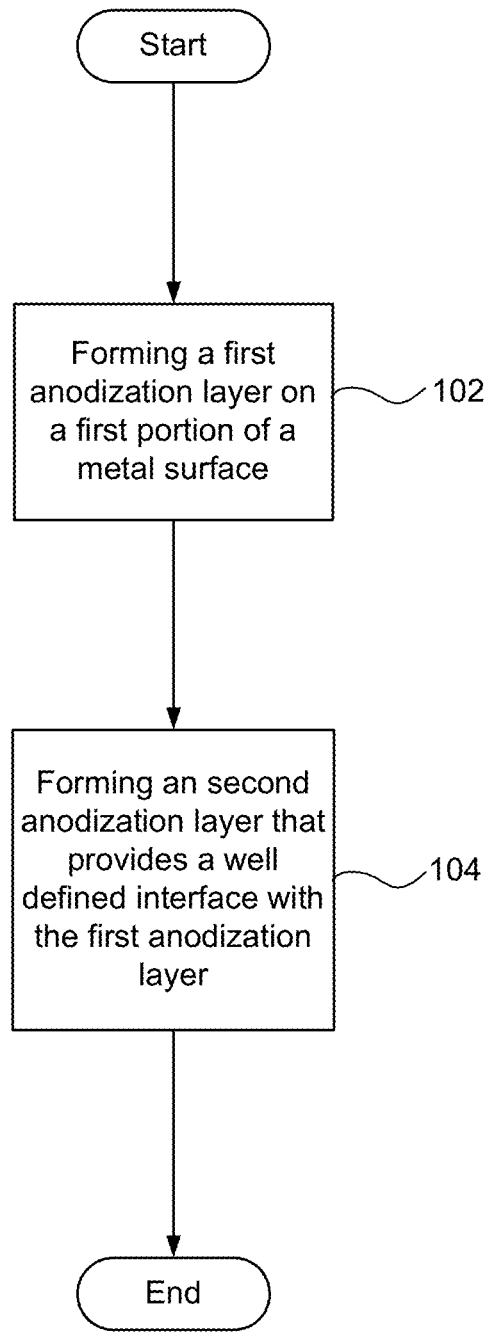
FIG. 1 is a flowchart illustrating a general double anodizing process in accordance with described embodiments.

The following disclosure describes various embodiments of electronic devices, such as portable electronic devices including, for example, mobile telephones. Certain details are set forth in the following description and Figures to provide a thorough understanding of various embodiments of the present technology. Moreover, various features, structures, and/or characteristics of the present technology can be combined in other suitable structures and environments. In other instances, well-known structures, materials, operations, and/or systems are not shown or described in detail in the following disclosure to avoid unnecessarily obscuring the description of the various embodiments of the technology. Those of ordinary skill in the art will recognize, however, that the present technology can be practiced without one or more of the details set forth herein, or with other structures, methods and components.

Representative applications of methods and apparatuses according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made without departing from the spirit and scope of the described embodiments.

In the detailed description, reference is made to metal or metal parts. In certain preferred embodiments, the metal is aluminum or aluminum alloy. However, a person of skill in the art would recognize that in the context of the present invention, the term metal refers to any suitable metal containing material capable of undergoing an anodization process, including pure elemental metal as well as a metal alloy or metal mixture.

The embodiments described herein relate to methods and structures for providing protective anodization layers on a metal part. Methods include a double anodizing process whereby the part undergoes a first anodizing process to create a first (or primary) anodization layer on a portion of the metal surface and a second anodizing process to create a second (or secondary) anodization layer which is adjacent to and in contact with the first anodization layer on a different portion of the metal surface. Described embodiments include methods for forming first and second anodization layers on angled metal surfaces wherein the anodization layers interface at edges of the metal part, the interface of the anodization layers being uniform and cosmetically appealing. In some embodiments, the first anodization layer can overlay a first metal surface having a first finish and the second anodization layer can overlay a second metal surface having a second finish. For example, the first finish can be rough or matted and the second finish can be highly reflective and/or have a design such as a logo or company mark.

In some embodiments, the second anodization layer is substantially transparent in order to reveal features of the underlying metal surface. The underlying metal surface can have a reflective shine or ornamental features which would be viewable through the transparent second anodization layer. In cases wherein the second anodization layer is transparent, the anodization film is thick enough to withstand wear. The thickness of the second anodization layer closely approximates the thickness of the first anodization layer so as to provide a smooth surface with substantially no offset of either the first or second anodization layer. This offset could also be controlled to improve durability (e.g., one layer could be made sub-flush to another, which can potentially make it less likely to be scratched).

FIG. 1 is a flowchart showing a general double anodizing process in accordance with described embodiments. At 102, a first anodization layer on a portion of an underlying surface is formed using a first anodizing process. The underlying surface can be a metal surface having a first finish, the first finish having any suitable characteristic and quality. For example, the first finish can be polished and smooth, machined or ground, or textured and rough. In one embodiment, the first anodization layer can be formed using a first anodizing process. The first anodizing process generally uses standard process parameters such as typical anodizing electric current density, bath temperature and anodizing duration. For example, the first anodizing process can be characterized by a bath temperature ranging from about 15 to 25 degrees C., an electric current density of about 1.5 Amp/dm$^2$ to about 2.0 Amp/dm$^2$, and an anodizing duration of about 10 to 40 minutes. The anodized layer using these parameters can be characterized as being substantially opaque, thus preventing an unobscured viewing of underlying features. Once the first anodization layer has been formed, an adjoining second anodization layer can be formed at a contiguous portion of the metal surface 104. The second anodizing process generally uses a lower electric current, higher bath temperature and longer anodizing duration than the first anodizing process. For example, the second anodizing process can be characterized as having an electric current density of about 0.4 Amp/dm$^2$ to about 1.0 Amp/dm$^2$, bath temperature of about 20 to 30 degrees C., and duration of greater than about 15 minutes. These anodization parameters result in a second anodization layer that has a different anodic oxide pore structure than that of the first anodization layer, creating a second anodization layer that can be characterized as substantially transparent. Since the second anodization layer can be substantially transparent, it allows a much less obscured viewing of underlying surface features that would not otherwise be possible using the first anodizing process. It should be noted that in some cases the relative transparency of the first anodization layer can be increased by reducing the overall thickness of the first anodization layer. However, this thinning of the first anodization layer generally reduces the protective properties of the first anodization layer. In contrast, the inherently higher degree of transparency afforded by the second anodization layer provides excellent viewability while maintaining the superior protective properties of the un-thinned second anodization layer.

Due to the different properties afforded the first and second anodization layers, an interface between the first and second anodization layers can be naturally well defined. Since the interface of the first anodization layer and the second anodization layer is regular, a uniform and cosmetically appealing line between the first and second anodization layers can be provided. Details about the regular, a uniform and cosmetically appealing interface between the first and second anodization layers will be described below.

Figure 2:
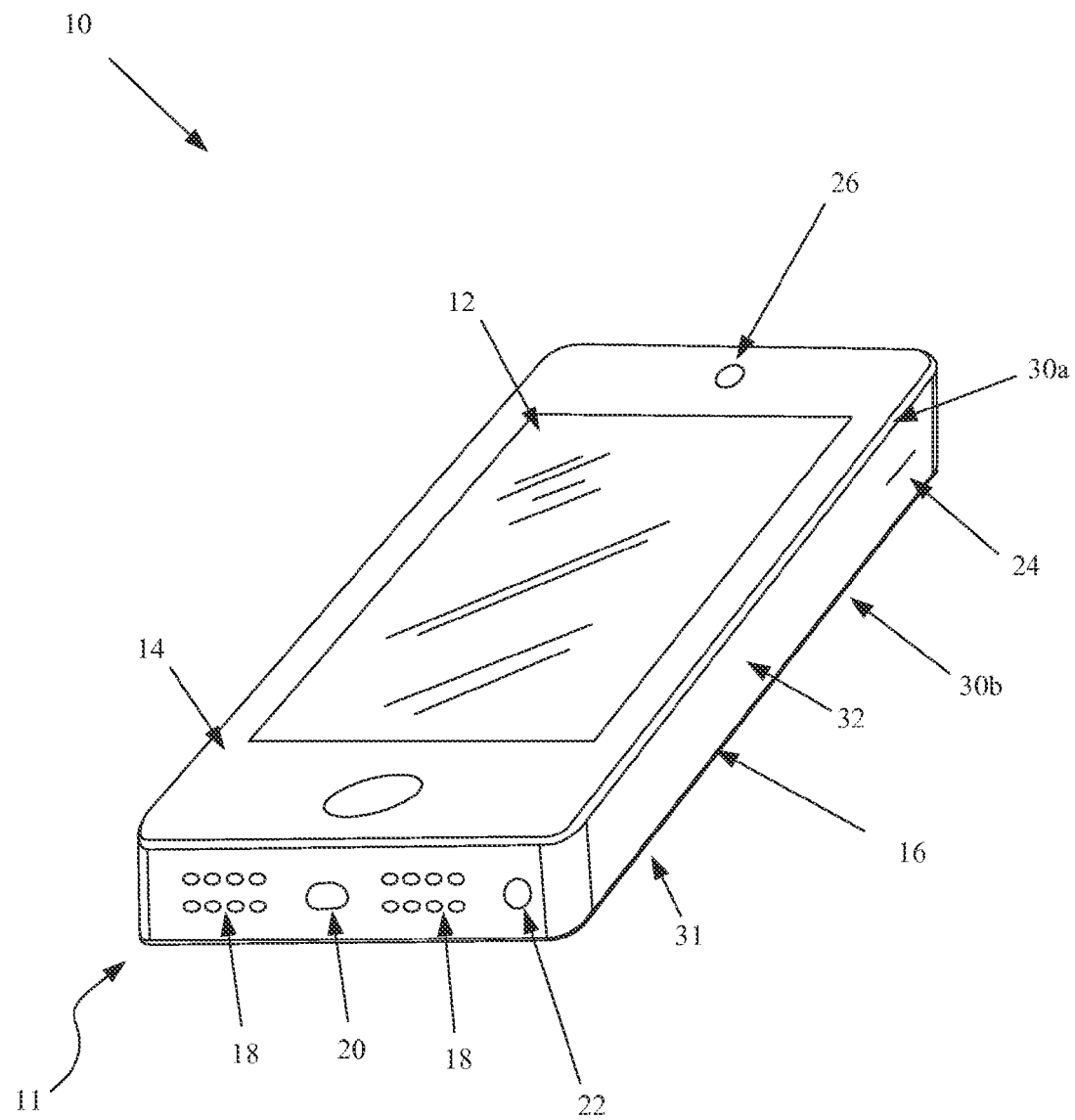
FIG. 2 is a schematic isometric view of a portable electronic device configured in accordance with an embodiment of the disclosure.

As discussed previously, methods of the embodiment can be applied in the fabrication of personal computers and electronic devices, including portable electronic devices. FIG. 2 is a schematic isometric view of a portable electronic device 10 ("electronic device 10"), such as a cellular telephone, configured in accordance with embodiments of the disclosure. In the illustrated embodiment, the electronic device 10 includes a body 11 carrying a display 12 that allows a user to interact with or control the electronic device 10. For example, the display 12 includes a cover or cover glass 14 that is operably coupled to a frame, housing, or enclosure 16. In certain embodiments, the display 12 and/or cover 14 can include touch sensitive features to receive input commands from a user. Moreover, in certain embodiments a cover can be positioned on one side of the electronic device 10, or a cover can be positioned on opposing sides of the electronic device 10.

As described in detail below, the enclosure 16 and the cover 14 at least partially house or enclose several internal features of the electronic device 10.

In the embodiment illustrated in FIG. 2, the enclosure 16 also at least partially defines several additional features of the electronic device 10. More specifically, the enclosure 16 can include audio speaker outlets 18, a connector opening 20, an audio jack opening 22, a card opening 24 (e.g., SIM card opening), a front facing camera 26, a rear facing camera (not shown in FIG. 1), a power button (not shown in FIG. 1), and one or more volume buttons (not shown in FIG. 1). Although FIG. 1 schematically illustrates several of these features, one of ordinary skill in the art will appreciate that the relative size and location of these features can vary.

In certain embodiments, the enclosure 16 can be made from a metallic material. For example, the enclosure 16 can be made from aluminum, such as 6063 Aluminum. In other embodiments, however, the enclosure 16 can be made from other suitable metals and/or alloys. According to additional features of the embodiment shown in FIG. 2, the enclosure 16 includes opposing edge portions 30 (identified individually as a first edge portion 30a and a second edge portion 30b) extending around a periphery of the body 11. In certain embodiments, one or both of the edge portions 30 can have a chamfered or beveled profile. For example, bottom portion 31 can meet side wall 32 at second edge portion 30b, which can be chamfered. As described in detail below, the chamfered edge portions 30 can be processed relative to the enclosure 16 to provide an aesthetically appealing appearance. For example, the exterior surface of the enclosure 16 can be treated and the edge portions 30 can subsequently be treated. In one embodiment, for example, a first anodization process can be applied to the enclosure 16 and a second subsequent anodization process can be applied to the edge portions 30. Additional suitable surface treatments, including intermediary surface treatments, can be applied to the enclosure 16 and/or the edge portions 30. In still further embodiments, the edge portions 30 can have other suitable profiles or shapes including and/or surface treatments.

Figure 3:
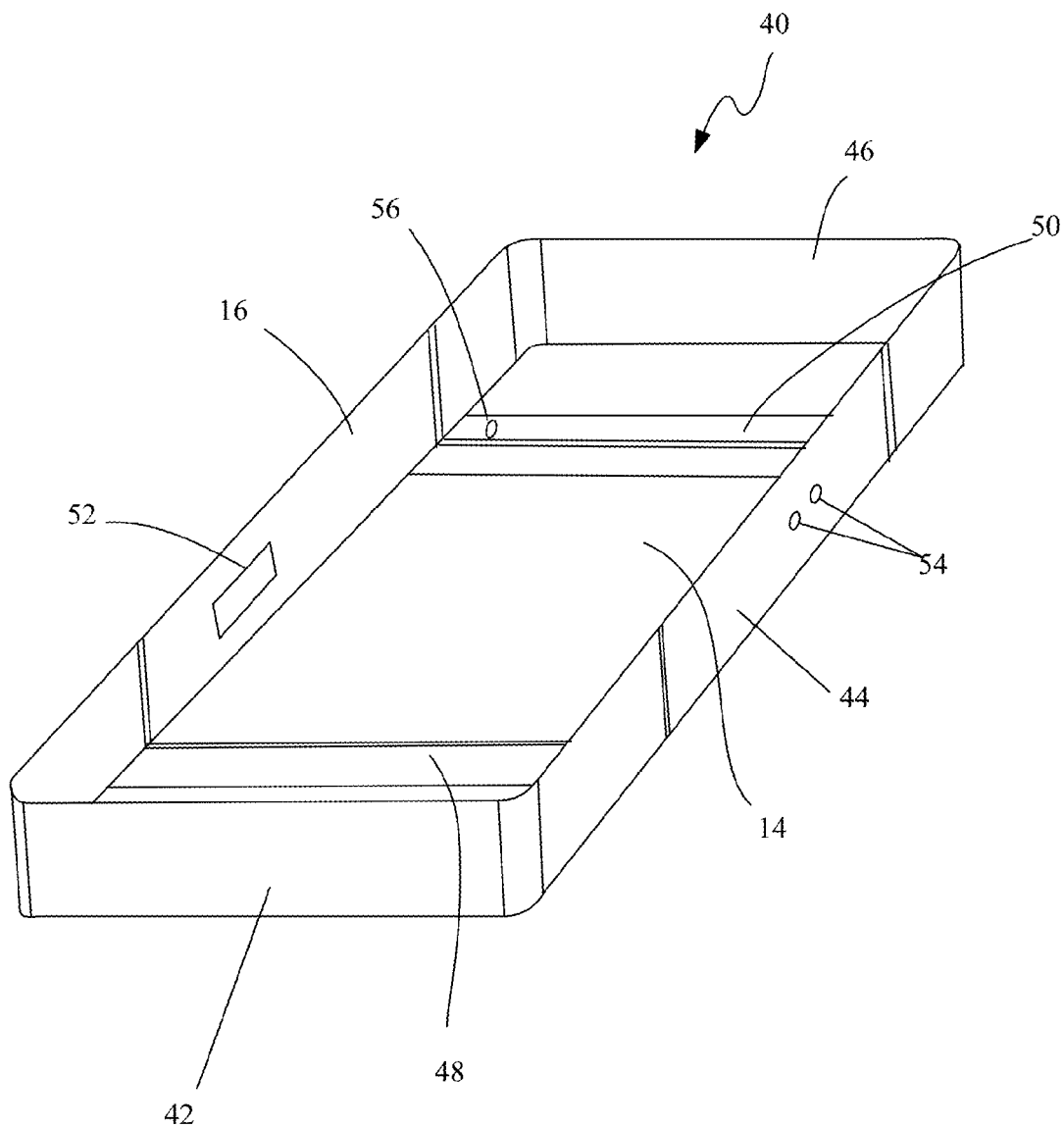
FIG. 3 is a schematic isometric view of at least a portion of a subassembly of the electronic device of FIG. 2.

FIG. 3 is a schematic isometric view of at least a portion of a subassembly 40 of the electronic device of FIG. 2. In the embodiment illustrated in FIG. 3, the subassembly 40 includes the enclosure 16 coupled to a cover, such as the cover 14 shown in FIG. 2. As shown in FIG. 3, the enclosure 16 includes a first enclosure portion 42 coupled to a second enclosure portion 44, which is in turn coupled to a third enclosure portion 46. More specifically, the enclosure 16 includes a first connector portion 48 that couples the first enclosure portion 42 to the second enclosure portion 44. The enclosure also includes a second connector portion 50 that couples the second enclosure portion 44 to the third enclosure portion 46. In certain embodiments, the first, second, and third enclosure portions 42, 44, and 46 can be metallic and the first and second connector portions 48 and 50 can be made from one or more plastic materials. For example, each of the first and second connector portions 48 and 50 can be formed from a two-shot plastic process that includes a first structural plastic portion that enjoins the corresponding enclosure portions and a second cosmetic plastic portion that at least partially covers the first plastic portions. These plastic portions can be configured to withstand harsh manufacturing processes and chemicals that may be used to form and process the enclosure, including chemicals used in the anodization process, UV light exposure, abrasives from a blasting process, coolants used in CNC steps and chemicals used to strip masking materials. These chemicals can include strong acids or bases applied at high or low temperatures and held for extended periods of time. Details regarding suitable two-shot plastic techniques are described below. In further embodiments, the enclosure portions 42, 44, and 46 and/or the connecting portions 48 and 50 can be made from other suitable materials including metallic, plastic, and other suitable materials.

According to additional features of the embodiment illustrated in FIG. 3, the enclosure 16 can include one or more low resistance conductive portions 52 (shown schematically) for grounding purposes. Conductive portions 52 can include, for example, of aluminum which can shield RF waves. The conductive portion 52 can be formed by removing one or more layers or portions of the enclosure 16 to provide a lower resistance through the enclosure 16 for antenna transmissions or communications. In certain embodiments, for example, the conductive portion 52 can be formed by laser etching or otherwise removing or etching an anodized portion of the enclosure 16. The exposed surfaces of conductive portion 52 can then be chemically treated to retain its electrical conductivity. Examples of suitable chemical treatment include chromate and non-chromate conversion coatings to passivate conductive portion 52. These coatings can be applied using techniques including spraying and brushing using a paint brush. The conductivity of the exposed portion 52, as well as through different portions of the enclosure 16, can be tested using suitable techniques such as using resistance using probes at different points of exposed portion 52 and enclosure 16 to assure that ground can be established though housing 16.

The illustrated subassembly 40 also includes several inserts 54 that provide increased structural connection strength relative to the enclosure 16. In embodiments where the enclosure 16 is formed from aluminum, for example, inserts 54 can provide increased strength and durability. In some embodiments, inserts 54 are conductive so that they can serve as electrical grounding features. In certain embodiments the inserts 54 can include threaded inserts or nuts that are configured to threadably engage a corresponding fastener. In some instances, inserts 54 are added to enclosure 16 before the part undergoes subsequent anodizing processes. In these cases, it is advantageous for inserts 54 to be made of material, such as titanium, that can withstand the chemically harsh anodizing process. If, for example, the inserts were made of steel or brass, they could become corroded by the anodizing chemicals which could destroy the part and also contaminate the anodizing bath. Titanium can anodize, but under the conditions used for anodizing aluminum, will anodize minimally and create little film growth. Thus, the titanium inserts will remain conductive and therefore suitable for electrical grounding, even after undergoing an aluminum anodizing process. In addition, since anodization will occur minimally on titanium, the geometry of any threaded regions of the inserts will remain substantially the same. It should be noted that in addition to titanium, other suitable hard metals materials can be used for the inserts, including hard aluminum alloys such as 7075 aluminum alloy. Inserts made of softer aluminum alloys can be used; however the softer aluminum inserts would anodize in the aluminum anodizing bath. Therefore, in order to keep the aluminum inserts electrically conductive and to retain any threaded geometry, it can be necessary to mask the aluminum inserts using, for example polymer plugs, prior to exposure to the anodizing bath. This masking process adds a manufacturing procedure and manual labor to the process.

According to yet additional features of the subassembly 40 shown in FIG. 3, the cover 14 can be securely coupled and/or offset (if desired) relative to the enclosure 16. More specifically, the cover 14 can be aligned with a reference plane or datum relative to the enclosure 16, and the enclosure 16 (and more specifically the first enclosure portion 42, the second enclosure portion 44, and/or the third enclosure portion 46) can include one or more access opening 56 to urge or bias the cover 14 relative to the enclosure 16 for secure attachment (e.g., adhesive attachment) while maintaining relatively tight tolerances between the coupled portions.

According to additional embodiments of the disclosure, the cover 14 can be made from a glass, ceramic, and/or glass-ceramic material. In one embodiment, for example, the cover 14 can be made from a glass with specific portions or volumes of the glass formed with ceramic properties. In other embodiments, however, the cover 14 can be formed from alumina silica based pigmented glass.

Figure 4:
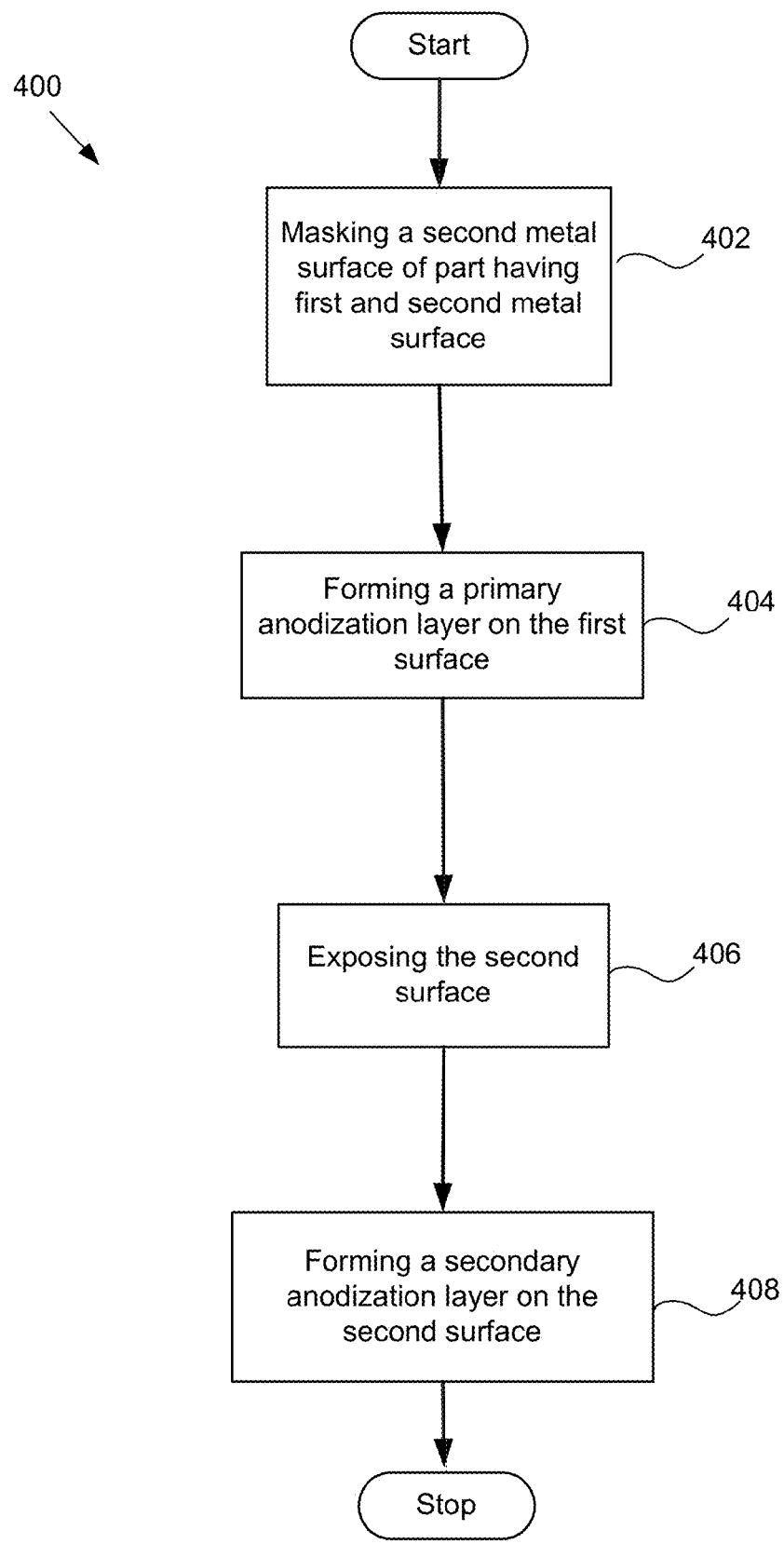
FIG. 4 is a flowchart illustrating details of a double anodizing process graphically presented in FIGS. 5A-5E.

As mentioned previously, embodiments described herein provide methods for forming a protective anodization layer or layers on exposed metal surfaces of an electronic device, such as the portable electronic device shown in FIGS. 2 and 3. FIGS. 4 and 5A-5E illustrate steps involved in an anodizing process in accordance with embodiments of the disclosure. FIG. 4 is a flowchart showing process steps. FIGS. 5A-5E graphically present views of a portion of a part undergoing the process described in FIG. 4. In the following narrative, reference will be made to the flowchart of FIG. 4 in conjunction with the graphical presentations of FIGS. 5A-5E.

Process 400 begins at 402 (corresponding to FIG. 5A) where a masking operation is performed on metal part 500 having a first surface 502 and a second surface 504. In FIGS. 5A-5E, first 502 and second 504 surfaces are contiguous portions of a surface of metal part 500. Mask 506 is formed on and is configured to protect second surface 504 from subsequent processes. Metal part 500 can be made of any suitable metal such as aluminum, stainless steel or titanium. In addition, metal part 500 can include other materials such as ceramic and ceramic containing materials. In particular embodiments, metal part 500 can be made of any of various grades of aluminum alloy including those in the 6000 series (e.g., 6063 and 6061), 5000 series (e.g., 5054 and 5052) and 7000 series. The use of different types and grades of metal will require that subsequent processes, such as anodizing, texturing and polishing processes, to have different parameters depending on the material properties and hardness of the metal.

Prior to masking, the part can optionally undergo cleaning operations to remove unwanted surface defects, dirt, dust, and so forth that can cause defects or otherwise adversely affect subsequent anodization processes. For example, the surface cleaning operations can include well known processes such as a wet polish. The wet polish can use slurry such as aluminum oxide slurry that in conjunction with a mechanical polisher can be used to remove machine marks and to create an even surface for blasting or other texturing process. In addition, the wet polish can be used to increase the gloss of any subsequent texturing procedure. In some cases, a mechanical chemical lapping can be performed using acidic or alkali slurry (e.g., aluminum oxide or silicon oxide) that can provide a mirror finish on the metal surface. After the optional polishing, artwork (e.g., company logo and/or text) can optionally be formed on a mirror finished metal surface, using for example, a photolithography process.

In certain embodiments, the masking and artwork procedures are performed together. The mask is a photoresist that can be applied on the part, using for example a spray coating operation. In certain embodiments, selected portions corresponding to the pattern of the artwork are then UV cured and the uncured portions removed leaving behind covered mirror finished surfaces corresponding to the artwork pattern. In some cases, UV curing can include the use of a UV laser. Other suitable masking techniques can include screen printing and pad printing processes. In some embodiments, the photoresist used to cover the artwork is formed from a photomask that has pre-distortion features at certain regions of the photomask in order to provide sharply defined corners in the resulting artwork on the part. Details of embodiments using pre-distorted photomasks will be described below with reference to FIGS. 13A, 13B and 14A-14D.

After second surface 504 of metal part is masked, the part can undergo an optional procedure to add texture to first surface 502. For example, a blasting operation can be performed whereby the part is exposed to a blasting media. In one embodiment, the blasting media takes the form of zirconia applied under about 1 bar of pressure. Alternatively, a chemical etching process can be used to impart a textured surface with a different quality than a blasted surface. Since second surface 504 is protected by mask 506, it will not be subject to the texturing or blasting and will retain previously provided surface features such as artwork and/or mirror polish.

At 404 (corresponding to FIG. 5B), the part undergoes a first anodizing process wherein first surface 502 is anodized forming a primary anodization layer 508 adjacent to and in contact second surface 504, wherein the second surface 504 is not affected due to protection by mask 506. Since anodizing involves converting a portion of a metal surface to an oxide layer, dashed line 514 represents the location where first surface 502 existed prior to the first anodizing process. Edge 512 of primary anodization layer 508 is adjacent to second portion 504 of the metal surface and is defined by an edge of mask 506. Prior to anodization, the part can optionally undergo cleaning operations to remove unwanted surface particles caused by previous processes that can cause defects or otherwise adversely affect subsequent anodization processes. Surface operations can include well known processes such as a degreasing operation using, for example a $Na_3PO_4$ solution, to remove surface impurities such as grease from machining or oils from handling; a chemically polishing using for example a $H_3PO_4$ solution bath to change the surface texture for cosmetic reasons; and a desmut operation using, for example a $HNO_3$, to remove residues from previous processes such as intermetallic particles at the surface of alloyed aluminum and to etch away any aluminum oxide passivation layer in preparation for anodizing. The first anodizing process at 404 typically involves use of an $H_2SO_4$ bath solution at a temperature of about 15 to 25 degrees C. In some embodiments, the quality of the anodization layer can be controlled by using a constant current density. In some embodiments, the current density is set to about 1.5 to 2.0 $A/dm^2$. It is also possible to control the quality of the anodization by setting a constant voltage. It should be noted that target voltage can vary depending on the size of the part. In general, the duration of anodization will determine the thickness of the primary anodization layer 508, which is preferably less than about 50 microns thick, more preferably less than about 25 microns thick. In cosmetic applications, primary anodization layer 508 is preferably less than about 15 microns thick. In certain embodiments, the anodization is performed for approximately 10 to 40 minutes resulting in a primary anodization layer 508 having a thickness of about 8 to 12 microns. After anodization is complete the part optionally undergoes a sealing operation using, for example a nickel acetate solution.

At 406 (corresponding to FIG. 5C), a portion of metal surface is exposed, including at least a portion of second surface 504. In the part shown in FIG. 5C, second surface 504 is exposed by removing mask 506. After mask 506 is removed, primary anodization layer 508 retains edge 512 adjacent to second surface 504. Second surface 504 retains any previously provided artwork, texturing or polishing. In addition, in some embodiments, a section of primary anodization layer 508 can be removed to expose a portion of the underlying metal. Metal exposure can be accomplished by using, for example, a cutting procedure or a laser or chemical etch procedure. Details regarding a cut part in accordance with some embodiments are described below with reference to FIGS. 10B-10E.

At 408 (corresponding to FIG. 5D), the part undergoes a second anodizing process, whereby a secondary anodization layer 510 is formed. Secondary anodization layer 510 is adjacent to and in contact with primary anodization layer 508. The second anodizing process occurs substantially only on exposed metal surfaces, such as second surface 504. Metal surfaces that have already been anodized by the first anodizing process 404 are protected from the second anodizing process 408 by primary anodization layer 508 which acts as a natural mask. This is because primary anodization layer 508 includes $AlO_2$ which is non-conductive and therefore not able to conduct the current required as a driving force in an electrochemical anodizing process. The resultant part 500 at FIG. 5D has two anodization layers 508 and 510 contacting at an interface defined by edge 512. In some embodiments, second anodizing process 408 uses different process parameters than first anodizing process 404, resulting in secondary anodization layer 510 having different film characteristics than primary anodization layer 508. In certain embodiments, second anodization process 408 uses process parameters that can provide a substantially transparent anodization layer. Process parameters for creating a transparent anodization layer are described in detail below with reference to FIGS. 6A and 6B.

In some embodiments, after second anodizing process 408 is complete, the part can optionally undergo a laser etch to remove selected portions of primary anodization layer 508. For example, selected portions of the primary anodization layer can be removed to expose conductive aluminum areas suitable for electrical grounding. The laser etched areas where the anodization layer has been removed can be treated with a conversion coating to ensure that the area retains conductivity using, for example, a chromate or non-chromate conversion coating treatment.

Figure 5A:
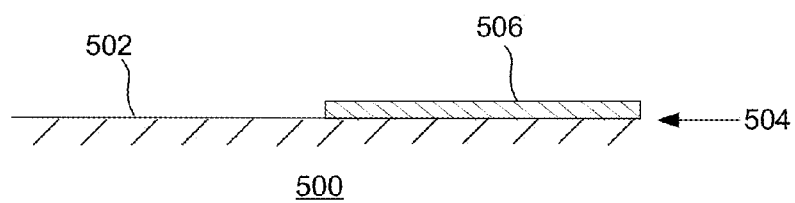
FIGS. 5A-5E graphically illustrate selected views of a part undergoing a double anodizing process in accordance with described embodiments.
Figure 5B:
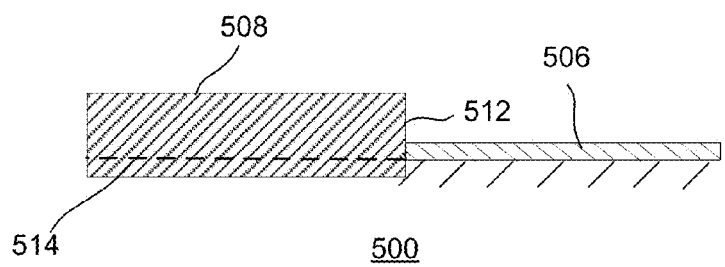
Figure 5C:
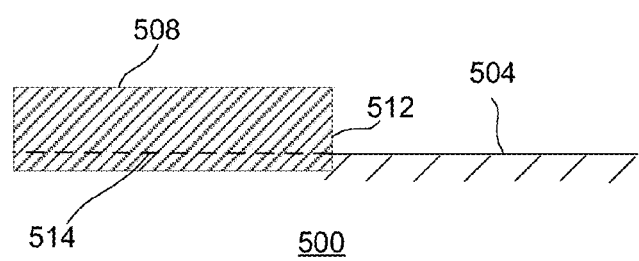
Figure 5D:
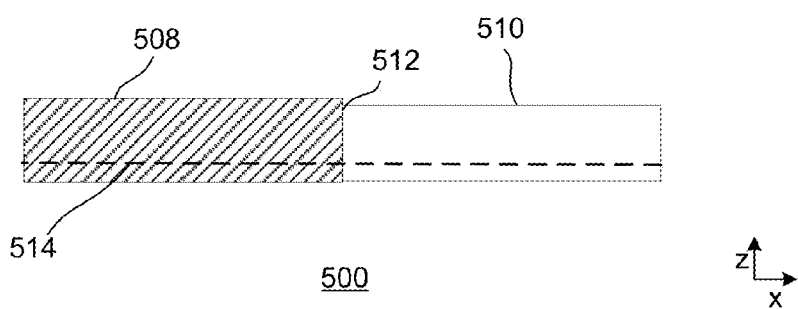
Figure 5E:
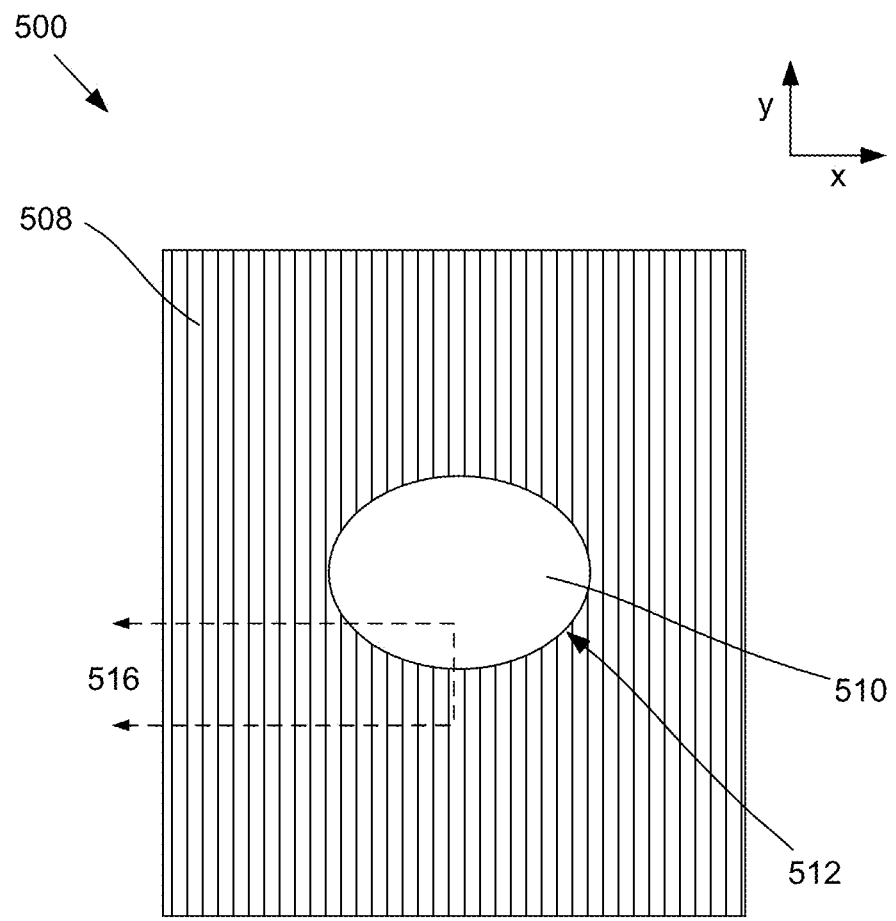

FIG. 5E illustrates another view of part 500 after undergoing the double anodizing process of 400. FIG. 5E shows a top down view of a larger portion of part 500, wherein FIG. 5D corresponds to section view 516. As shown in FIG. 5E, secondary anodization layer 510 is disposed adjacent to primary anodization layer 508. As shown by FIGS. 5D and 5E, the interface between first 508 and second 510 anodization layers is defined by edge 512 of primary anodization layer 508. The resultant part 500 at FIG. 5D has two anodization layers 508 and 510 which can have different film qualities and can appear different from each other from an observer's perspective, such as a user of an electronic device. For example, if primary anodization layer 508 is opaque and secondary anodization layer 510 is transparent, a user can only view the portion of metal surface below secondary anodization layer 510.

As described above with reference to FIGS. 5A-5E, secondary anodization layer 510 can be substantially transparent. The process parameters for forming a transparent anodization films are generally different from process parameters for forming substantially opaque anodization films. For example, a transparent anodizing process typically uses an electrical current density of about 0.4 to 1.0 A/dm², which is substantially lower than other anodizing processes such as the first anodizing process 404 described above and conventional anodizing processes. Instead of a constant current density, a constant voltage can be used to form a transparent anodization layer. For example, a lower voltage than conventional anodizing processes can be used. It is believed that the lower current density or voltage results in a smaller average pore size and finer pore structure in the resultant anodization layer. Pores are vertical voids that naturally form in the microstructure of an anodization film during an anodization process. In addition, a bath temperature of about 20 to 30 degrees C. is typically used to form the transparent anodization layer, which is substantially higher than, for example, the bath temperature of the first anodizing process 404 described above. It is believed that the higher bath temperature results in an increased pore density. The combination of the finer pore structure and increased pore density manifests in a more transparent anodization layer as well providing a glossier surface on the anodization layer compared to conventional anodization layers. Details regarding physical characteristics and microstructure of a transparent anodization layer in accordance with described embodiments will be described below with reference to FIGS. 6A and 6B.

The anodizing duration for forming a transparent anodization layer can vary depending on other process parameters and on the desired thickness of the resultant anodization layer. In addition, a film growth maximum can reached given certain process parameters such as current density, voltage and bath temperature. For applications such as the part described above with reference to FIGS. 4 and 5A-5E, anodizing is typically performed for more than about 15 minutes, resulting in a transparent anodization layer having a thickness of about 7 to 9 microns.

As described above, the microstructure of a transparent anodization layer in accordance with described embodiments has a different pore size and density characteristics compared to opaque anodization layers. To illustrate, FIGS. 6A and 6B graphically illustrate differences in the film characteristics of a transparent anodization layer and a substantially opaque anodization layer, such as first anodization layer 508 of FIGS. 5A-5E. FIGS. 6A and 6B depict close-up views of selected profiles of anodization layers formed using two different anodizing processes on an aluminum (Al-6063) substrate. As mentioned above, anodic films can have porous microstructures with pores formed within the metal oxide material. FIG. 6A depicts the porous microstructure of an anodization layer 600 formed on barrier layer 614, which is in turn formed on aluminum substrate 612. Barrier layer 614 is a thin dense layer of uniform thickness that is the initial layer of oxide growth on metal substrate 612 during the anodization process. Details regarding the formation of a barrier layer in accordance with described embodiments are described below with reference to FIGS. 8 and 9A-9C. Aluminum substrate can have any suitable surface features such as a textured surface from, for example a blasting procedure or etching procedure. Anodization layer 600 is formed using a current density of between about 1.5 to 2.0 A/dm² and electrolyte (bath) temperature of between about 15 to 25 degrees C. for between about 10-40 minutes (first anodizing process 404). The resulting anodization layer (or metal oxide layer) 600 has pores 602 that have an average pore diameter of about 11-13 nm formed within metal oxide having cell walls 604 with an average wall thickness of about 5-6 nm. FIG. 6B depicts the porous microstructure of an anodization layer (or metal oxide layer) 606 formed on barrier layer 618 and aluminum substrate 616. Aluminum substrate 616 can have any suitable surface features such as a highly reflective shine. Anodization layer 606 is formed using a current density of between about 0.4 to 1.0 Amps/dm² and electrolyte temperature of between about 20 to 30 degrees C. for a duration of more than about 15 minutes (second anodizing process 408). The resulting anodization layer 606 has pores 608 that have an average pore diameter of about 6-9 nm formed within metal oxide having cell walls 610 with an average wall thickness of about 4-5 nm. Thus, anodization layer 606 has approximately 2 to 3 times higher pore density than anodization layer 600. In addition, the average pore diameter of anodization layer 606 is smaller than the average pore diameter of anodization layer 600. The densely packed pores of anodization layer (or metal oxide layer) 606 provide a light transmissible path between a top surface of anodization layer (or metal oxide layer) 606 and barrier layer 618, making anodization layer 606 substantially transparent. Barrier layer 618 is very thin and generally does not impede the transmission of light. Thus, when incident light directed at anodization layers 600 and 606, anodization layer 606 is more likely to permit light, such as from the external environment, to pass to the surface of underlying aluminum substrate 616, reflect off of aluminum substrate 616, and be transmitted back through anodization layer 606 and to the external environment. In this way, anodization layer 606 can allow a substantially unobstructed view by an observer of underlying aluminum substrate 616. Underlying aluminum substrate 616 can include surface features, such as a shiny reflective surface, surface texture such as a blasted surface, or artwork that can be viewable from an observer. In contrast, anodization layer 600 is substantially opaque and generally does not allow an unobstructed view of underlying aluminum substrate 612.

Figure 7A:
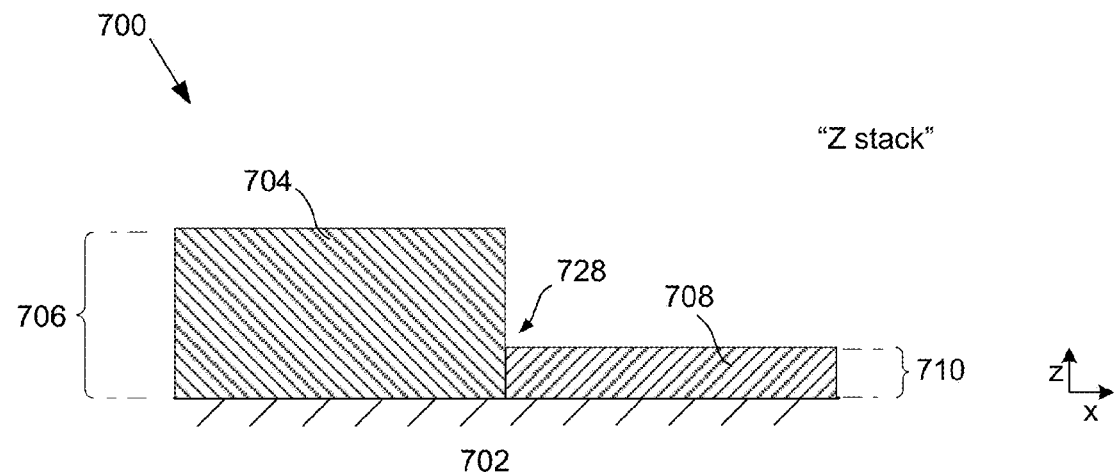
FIGS. 7A and 7B graphically illustrate selected profiles of two separate parts that have undergone two different anodizing processes.
Figure 7B:
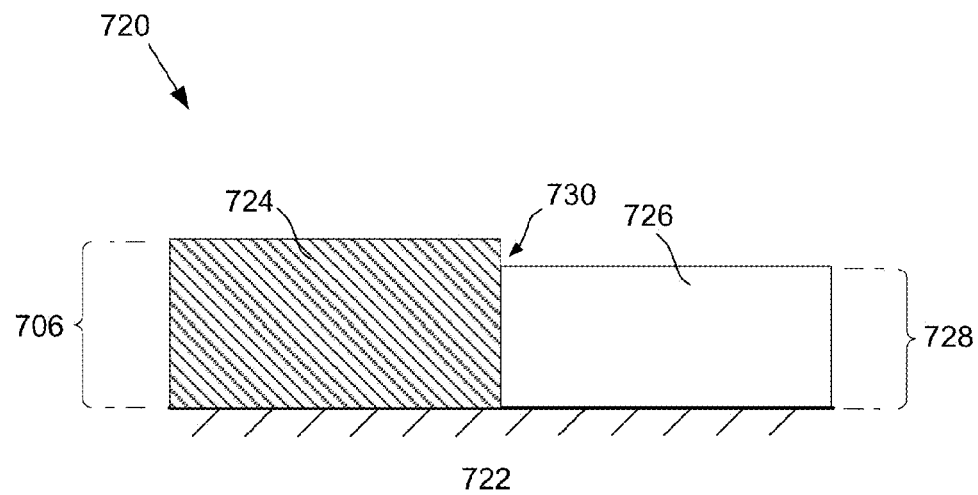

It should be noted that conventional methods for forming a transparent anodization layer require that the anodization layer be thin, for example 2 to 3 microns, in order to maintain a transparent quality. However, such a thin anodization layer is more susceptible to damage such as scratching. An advantage of embodiments presented herein is that a transparent anodization layer can be formed to approximate the thickness and scratching resistance of an adjacent opaque anodization layer while providing a transparent quality normally associated with thinner anodization films. In addition, the transparent anodization layer described herein can be significantly harder than a layer of 2-3 micron anodized film using a conventional anodizing process. These features are illustrated in FIGS. 7A and 7B, which show selected side view profiles of two parts, 700 and 720 that have undergone different anodizing processes. FIG. 7A shows part 700 which has undergone a conventional anodizing process using standard processing parameters, forming opaque anodization layer 704 that has a thickness 706 of about 8 to 12 microns. Part 700 has also undergone another conventional anodizing process to form adjacent anodization layer 708 which has thickness 710 of about 2 to 3 microns. Anodization layer 708 is substantially transparent, revealing underlying metal 702. However, the relative low thickness of anodization layer 708 can make it more vulnerable to scratching and damage that may occur during, for example, normal use of an electronic device. In addition, the thicknesses of adjacent anodization layers 704 and 708 differ by about 5 to 10 microns, which can allow debris, such as dirt, grease and other particles, to form at the interface 728 of the thinner anodization layer 708 and thicker first anodization layer 704 during normal use of an electronic device.

FIG. 7B shows part 720 which has undergone a different anodizing process than part 700 in FIG. 7A. Part 720 has undergone a conventional anodizing process using standard processing parameters, forming opaque anodization layer 724 that has a thickness 706 of about 8 to 12 microns. Part 720 has additionally undergone an anodizing process using process parameters in accordance with described embodiments to form adjacent transparent anodization layer 726. Because layer 726 is transparent, underlying surface features of metal 722 are viewable from the top surface of transparent layer 726. Transparent anodization layer has a thickness 728 of about 7 to 9 microns, a relatively large thickness capable of withstanding normal wear during normal use of an electronic device. In addition, the thicknesses of adjacent anodization layers 724 and 726 differ by about 0 to 5 microns, which reduces the likelihood for debris to form at the interface 730 between the two anodization layers during normal used of an electronic device. In addition, since the thickness of transparent anodization layer 726 approximates the thickness of adjacent anodization layer 724, the overall top surface of the anodization layers is more uniform, smooth and aesthetically appealing.

Figure 8:
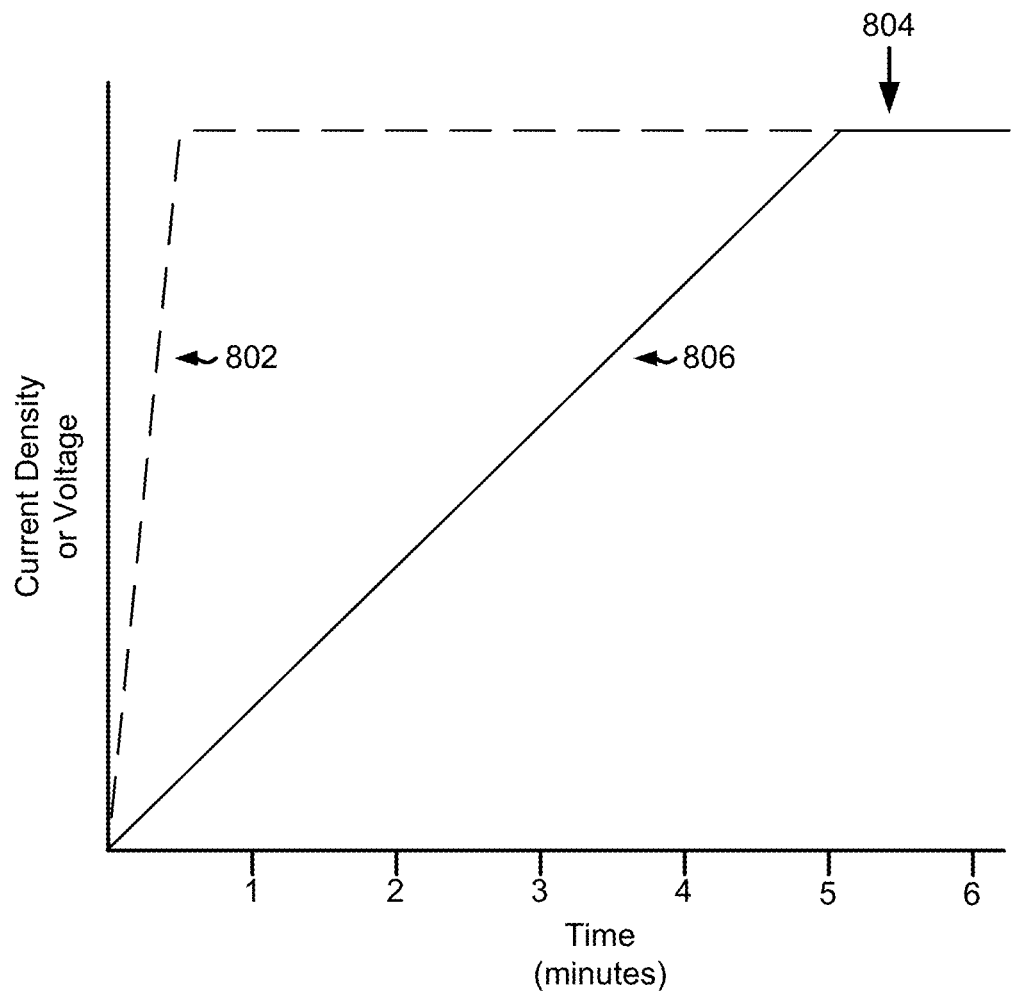
FIG. 8 is a graph showing the current density or voltage change as a function of time for a slow ramp up anodizing procedure in accordance with described embodiments.

In some embodiments, the anodizing process for forming a transparent anodization layer includes a slow ramp up procedure wherein the anodizing current density or voltage is slowly ramped up to a target anodizing current density or voltage used for bulk film growth. FIG. 8 is a graph showing current change as a function of time for a slow current ramp up procedure in accordance with the described embodiments. FIG. 8 shows that in a more conventional current density or voltage ramp up 802, the current density or voltage increases quickly over time to target anodizing current density or voltage 804. In this case, current density or voltage ramp up 802 increased to the target current density or voltage over a period of 0.5 minutes. For example, if the target anodizing current density 804 is 1.5 Amps/dm$^2$, in a standard ramp up procedure the current density would be ramped up from 0 Amp/dm$^2$ to 1.5 Amps/dm$^2$ over a 0.5 minute period. In a slow ramp up 806, in accordance with certain embodiments, the current density or voltage is increased at a much slower pace to target current density or voltage 804, for example, over at least about a 5 minute period. For example, if the target anodizing current density 804 is 1.5 Amps/dm$^2$, in a slow ramp up procedure the current density would be ramped up from 0 Amp/dm$^2$ to 1.5 Amps/dm$^2$ over at least a 5 minute period. It is believed that the slower current density or voltage ramp up results in the formation of a more uniform barrier layer which promotes growth of a more uniform bulk anodization layer thereon, and therefore more conducive to forming a transparent bulk anodization layer thereon.

Figure 9A:
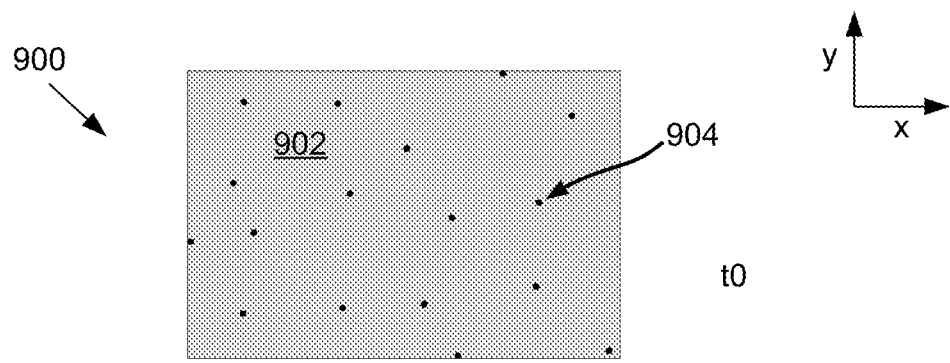
FIGS. 9A-9C are schematic top down views of a portion of a metal surface undergoing a slow ramp up anodizing procedure in accordance with described embodiments.
Figure 9B:
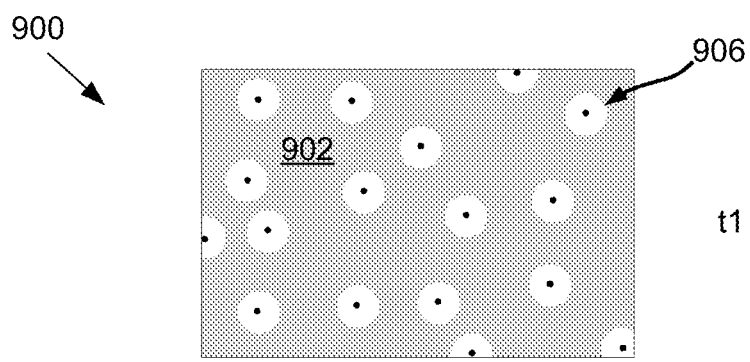
Figure 9C:
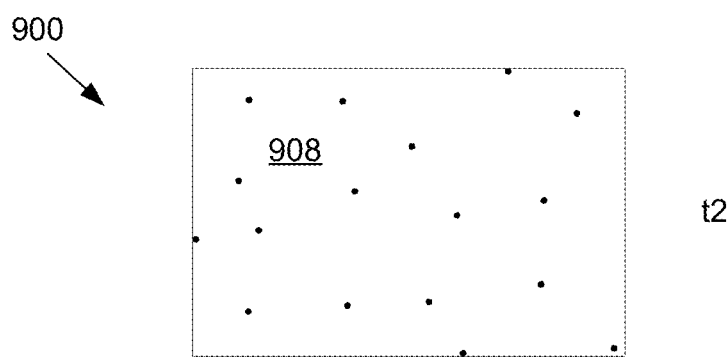

FIGS. 9A-9C illustrate top down views of a part 900 with a portion of metal surface undergoing an anodizing process which involves a slow ramp up procedure as describe above with reference to FIG. 8. In FIG. 9A, at the beginning of the slow ramp up procedure (t0), anodization material starts to form at nucleation sites 904 on metal surface 902. At FIG. 9B, the slow ramp up has proceeded for a time (t1) and anodization material 906 has slowly grown outward from nucleation sites 904. At FIG. 9C, the slow ramp up has proceeded for a longer time (t2) and anodization material has grown outward from nucleation sites 904 to the point that anodization material such that anodization material completely cover the surface of metal surface 902, thereby forming barrier layer 908. Because the current density or voltage is allowed to ramp up slowly, for example during about a 5 minute period, the anodization film grows more slowly and uniformly around nucleation sites 904, thus providing a more uniform barrier layer 908. The ramp up time period is preferably at least about 5 minutes. Once barrier layer 908 has been formed, the current density or voltage can then be maintained at a target current density or voltage to continue bulk anodization film growth. It is believed that the formation of a uniform barrier layer promotes a more uniform bulk anodization film growth thereon, resulting in a overall uniform and more transparent final anodization layer. Note that the slow ramp procedure can involve the slow ramp up of current density or voltage to a target current density or voltage.

Figure 9D:
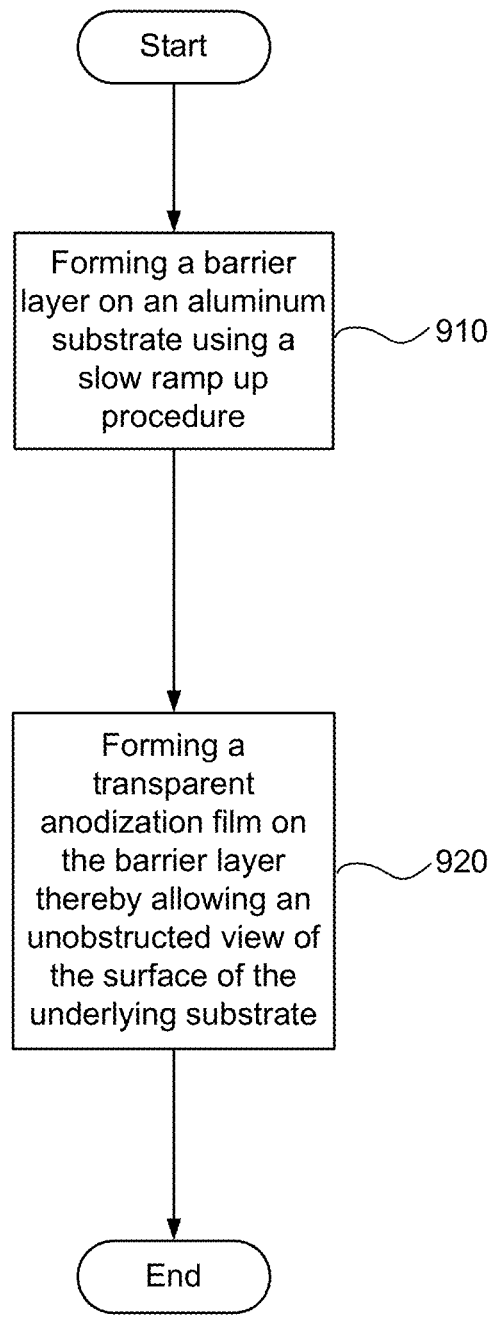
FIG. 9D is a flow chart illustrating details of a process for forming a barrier layer and transparent anodizing layer on a substrate in accordance with described embodiments.

FIG. 9D is a flow chart illustrating details of a process for forming a barrier layer and transparent anodization film in accordance with described embodiments. At 910, a barrier layer is formed on an aluminum substrate using a slow ramp up procedure as described above. As described previously, some embodiments can involve the slow ramp up of current density and other embodiments involve the slow ramp up of voltage. The resultant barrier layer is uniform and can promote uniform anodization film growth thereon. The barrier layer is sufficiently thin as to provide an unobstructed view of the underlying aluminum substrate. At 920, a transparent anodization film is disposed directly on the barrier layer using the process parameters described above (FIG. 6B, anodization layer 606). The resulting transparent anodization layer has pores that are sufficiently small in diameter and sufficiently densely packed so as to provide light transmission through the transparent anodization layer from the top surface of the anodization layer to the top surface of barrier layer. Since the barrier layer does not substantially obstruct transmission of light, a viewer can be permitted a substantially unobstructed view of a surface feature on the aluminum substrate. As described above, although the transparent anodization layer can provide a substantially unobstructed view of an underlying substrate, it can be formed at a thickness to maintain a high resistance to wear such as scratching.

Figure 10A:
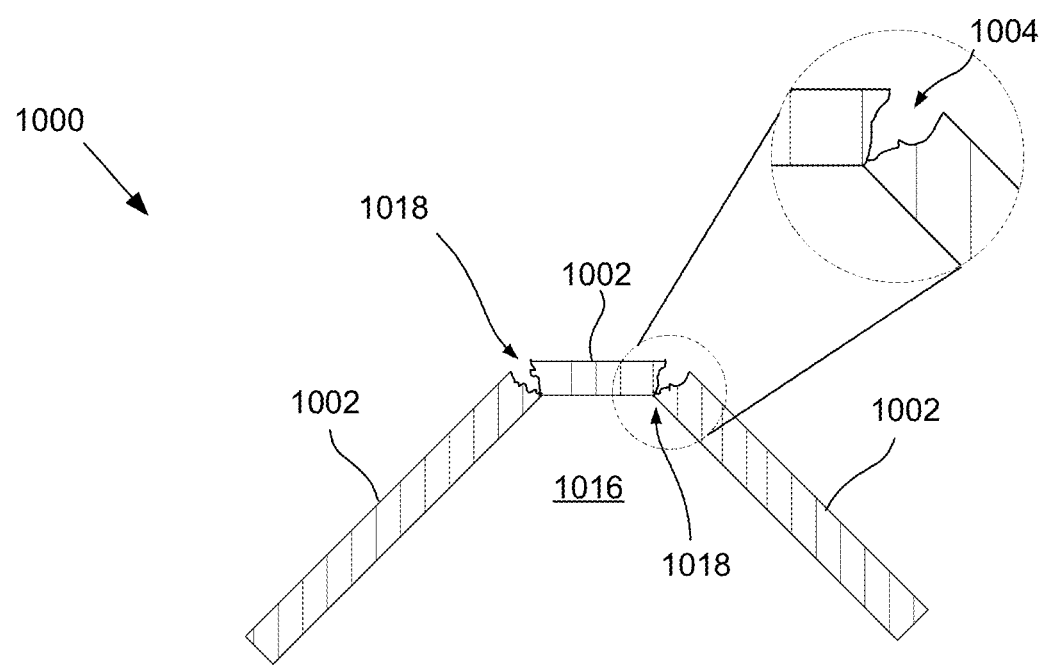
FIG. 10A graphically illustrates a selected profile of a part having an angled surface undergoing a single anodizing process.
Figure 10C:
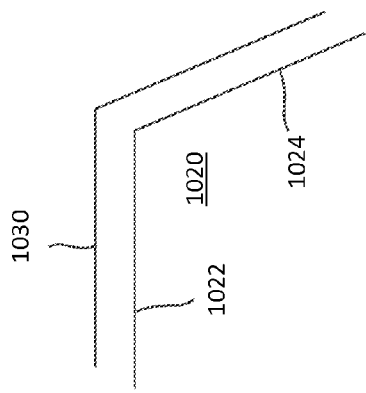
FIGS. 10B-10E graphically illustrate selected profiles of a part having an angled surface undergoing a double anodizing process in accordance with described embodiments.

As described above, embodiments described herein are suitable for providing a cosmetically appealing and protective anodization layer on angled metal surfaces, such as the chamfered surfaces 30a and 30b shown in FIG. 2. In conventional methods, a single anodization layer is typically formed on a metal surface, including portions of the metal surface having angles and corner. Embodiments described herein provide a double anodization process whereby at least two separate anodization layers are formed on different portions of the angled metal surface, thereby creating a more uniform and appealing appearance at the angled edges and corners. To illustrate, FIG. 10A shows a selected profile of a part 1000 having edges 1018 which has undergone a single anodizing process, thereby forming anodization layer 1002 on metal substrate 1016. It should be noted that for simplicity, FIG. 10A does not show a barrier layer or location of the metal surface prior to anodizing (such as those represented by dashed lines in FIGS. 5A-5D). As shown in the inset view, anodization layer 1002 has irregular cracks 1004 that meander between the side surfaces and top surface of the edges 1018. When viewed from a high level perspective, meandering cracks 1004 reflect light and become visible at different angles depending on whether the crack is on the side surfaces or top surface of the angled regions. The result is blurred features on part 1000 that appear as an uneven edge highlights which are not aesthetically appealing.

In embodiments described herein, a process involving two anodizing procedures is performed on angled surfaces to provide an aesthetically appealing protective layer. Suitable surfaces include a housing of consumer electronic product such as the portable electronic device of FIGS. 2 and 3. In some embodiments the consumer electronic product has a single piece metal housing having top and bottom portions with side walls. The consumer electronic product can have a front opening surrounded and defined by the top portion. The bottom portion and side wall can cooperate with the top portion to form a cavity in cooperation with the front opening. In some embodiments, a chamfered portion is disposed between the top portion and a side wall. Described embodiments can be used for providing a protective anodization layer on top and bottom portions, side walls and chamfered portion of the consumer electronic product.

To illustrate, FIGS. 10B-10E show selected profiles of a metal surface, such as the edge of an electronic device housing, undergoing a double anodizing process. At FIG. 10B, metal part 1020 has first surface 1022, having a first surface orientation vector 1026 which is orthogonal to first surface 1022, and second surface 1024, having a second surface orientation vector 1028 which is orthogonal to second surface 1024. Note that first 1026 and second 1028 surface orientation vectors are reference vectors for surfaces 1026 and 1024, respectively, and not intended to show overall direction of subsequent oxide growth. At FIG. 10C, primary anodization layer 1030 is grown on a selected portion of metal part 1020 that includes first 1022 and second 1024 surfaces. It should be noted that for simplicity, FIGS. 10C-10E do not show barrier layers or locations of the metal surfaces prior to anodizing (such as those represented by dashed lines in FIGS. 5A-5D). At FIG. 10D, a contiguous portion of primary anodization layer 1030 and a corresponding pre-determined amount of underlying metal housing are removed to form chamfered assembly 1032. In some embodiments, the removing involves cutting metal part 1020 using a cutter. In some embodiments, the cutting provides a mirror reflective surface. In some embodiments, removing can involve a laser and/or etch procedure. Chamfered assembly 1032 includes third surface 1034 having a third surface orientation vector 1036 which is orthogonal to third surface 1034. Third surface 1034 is contiguous with and disposed between remaining portions 1038 and 1040 of first 1022 and second 1024 surfaces.

Figure 10E:
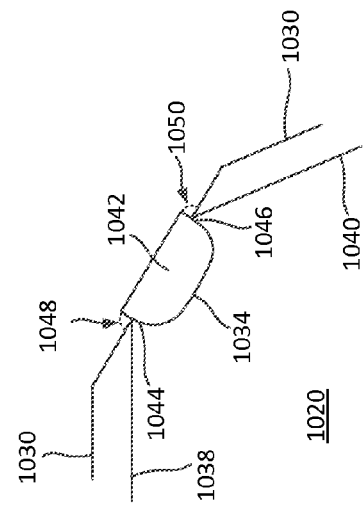
Figure 10B:
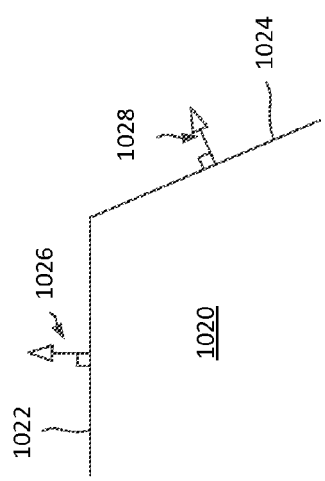
Figure 10D:
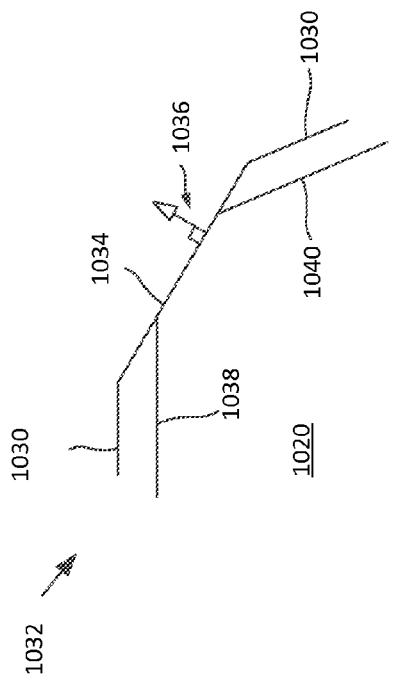

At FIG. 10E, a secondary anodization layer 1042 is grown on third surface 1034 in accordance with third surface orientation vector 1036. Note that third surface orientation vector 1036 is a reference vector for surface 1034 and not intended to show overall direction of subsequent oxide growth. In some embodiments, the secondary anodization layer and primary anodization layers have different properties, such as pore density and average pore size as described above with reference to FIGS. 6A and 6B. Because of the nature of an anodizing process, secondary anodization layer 1042 grows in a substantially orthogonal direction with respect to third metal surface 1034. Secondary anodization layer 1042 grows substantially only on exposed metal surfaces such as third surface 1034. Since anodizing is generally a conversion process where a portion of metal part 1020 is converted to an oxide, secondary anodization layer 1042 is shown to grow inward with a portion of secondary anodization layer 1042 that extends above third surface 1034. Secondary anodization layer 1042 includes first edge 1044 adjacent to remaining portion 1038 and second edge 1046 adjacent to remaining portion 1040. First 1044 and second 1046 edges align with third orientation vector 1036 such that a first angle 1048 between first edge 1044 and remaining portion 1038 of the first surface is about equal to a second angle 1050 between second edge 1046 and remaining portion 1040 of the second surface. Thus, the interfaces between secondary anodization layer 1042 and primary anodization layer 1030 are regular and well defined which from a high level perspective appear as neat lines that are cosmetically appealing. It should be noted that the thickness of secondary anodization layer 1042 can closely approximate the thickness of primary anodization layer 1030, thus providing an overall smooth quality at the angled metal region of part 1020. In some embodiments, the difference in thickness between primary 1030 and secondary 1042 anodization layers is about 5 microns or less. Thus, the described embodiments can be used to form smooth and aesthetically pleasing anodization layers on edged surfaces.

Figure 11:
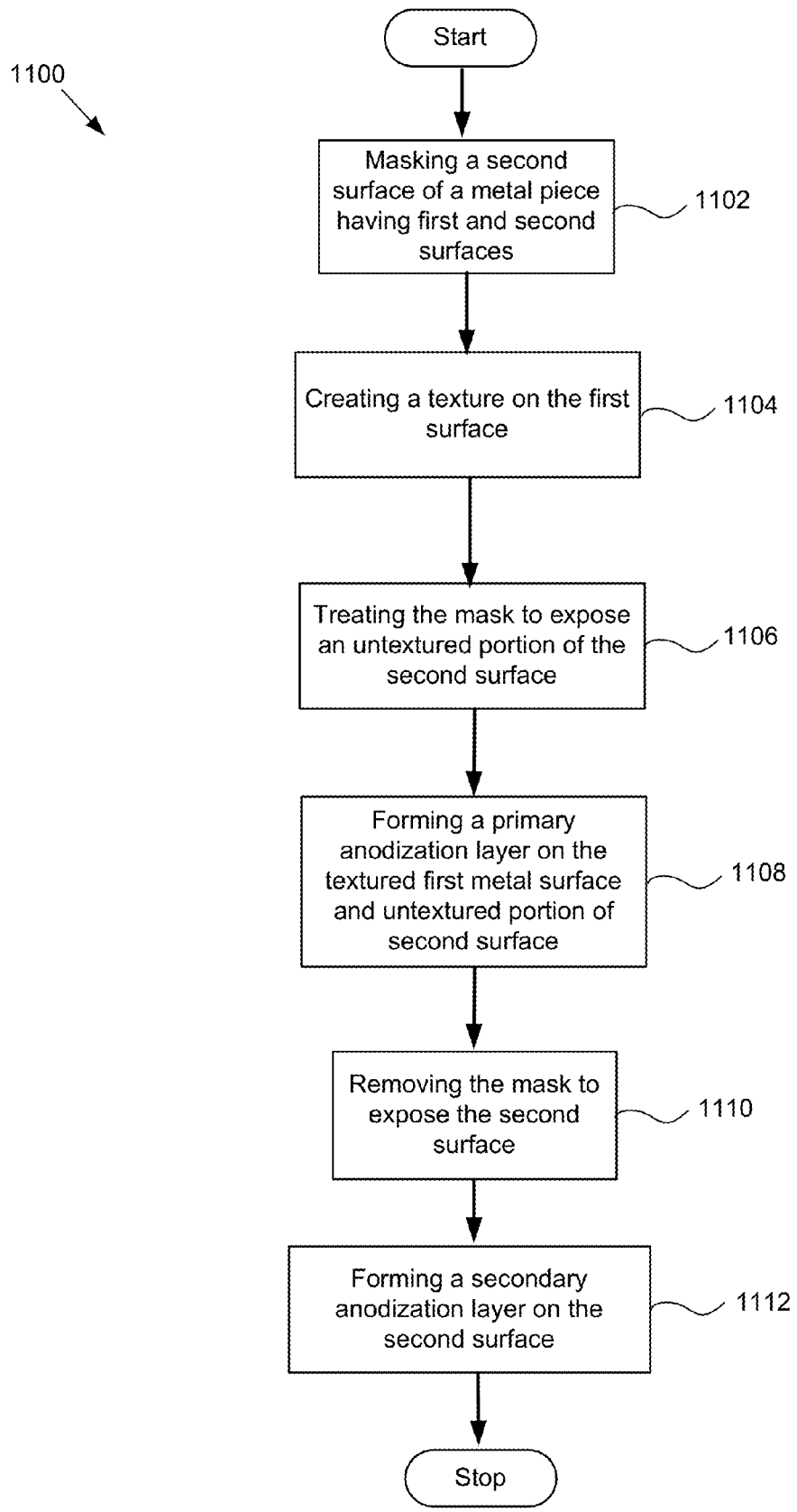
FIG. 11 is a flowchart illustrating details of an anodizing process graphically presented in FIGS. 12A-12F.
Figure 12A:
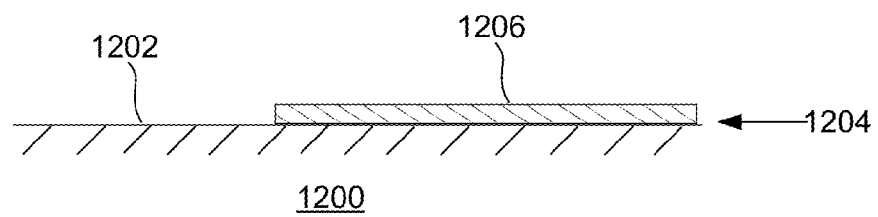
FIGS. 12A-12F graphically illustrate selected profiles of a part undergoing an anodization process which includes a highlighting technique in accordance with the described embodiments.
Figure 12B:
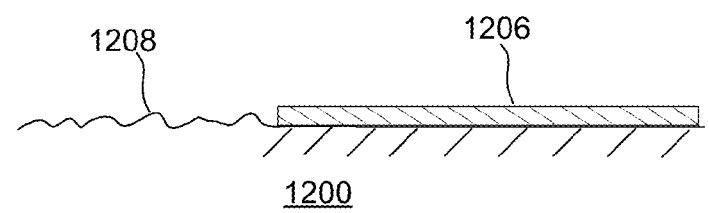
Figure 12C:
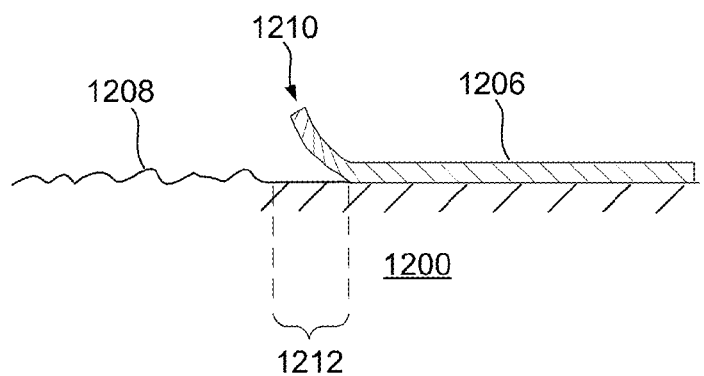
Figure 12D:
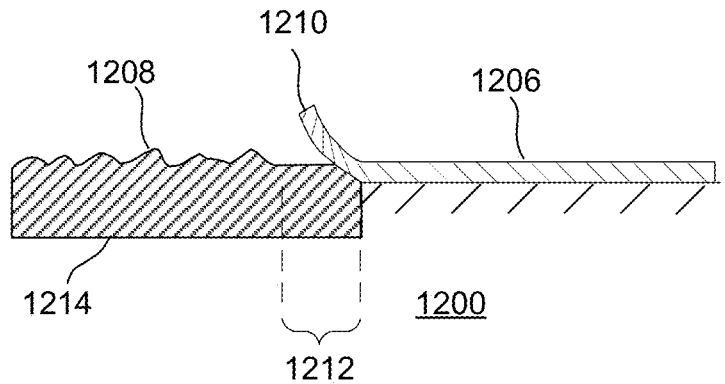
Figure 12E:
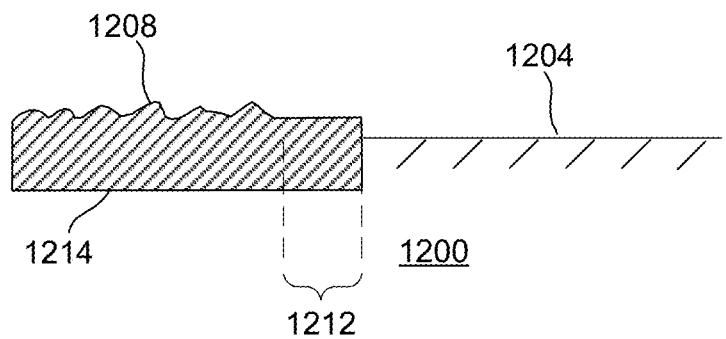
Figure 12F:
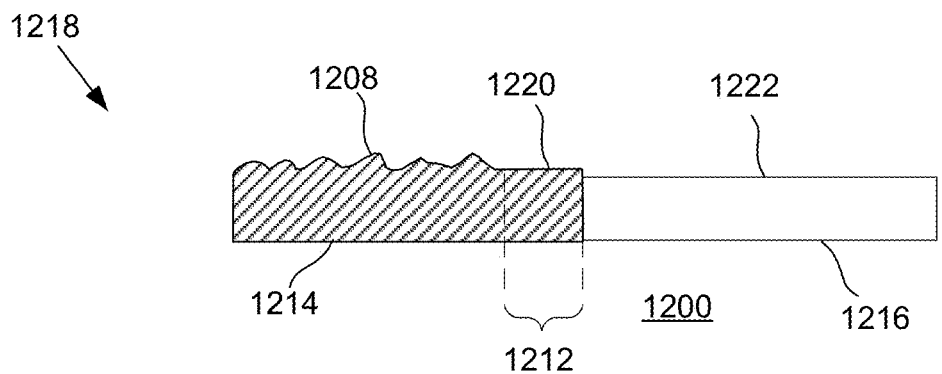

In addition to forming regular and well defined lines at edged metal surfaces, certain embodiments can provide an enhancing highlight effect at the interface between a primary anodization layer and secondary anodization layer. FIGS. 11 and 12A-12F illustrate steps involved in a highlighting process wherein a highlighted boundary is formed between two anodization layers in accordance with described embodiments. FIG. 11 is a flowchart showing process steps. FIGS. 12A-12F are graphical side views of a portion of a part undergoing the process described in FIG. 11. In the following narrative, reference will be made to both the flowchart of FIG. 11 in conjunction with the side view presentations of FIGS. 12A-12F.

Process 1100 begins at 1102 (corresponding to FIG. 12A) where a masking operation is performed on metal piece 1200 having a first surface 1202 and second surface 1204, forming mask 1206 on second surface 1204. The mask can be any suitable mask capable of withstanding a subsequent blasting and anodizing process. In some embodiments, a photoresist mask is used, wherein the photoresist has a pattern. First 1202 and second 1204 surfaces are adjacent and contiguous with each other. At 1104 (corresponding to FIG. 12B), a texture 1208 is created on first metal surface 1202. Texture 1208 can be, for example, a rough or "blasted" surface created from a blasting operation. The blasting operation can include, for example, exposing the metal piece to a blasting media such as zirconia applied under pressure (e.g., 1 bar). At 1106 (corresponding to FIG. 12C), mask 1206 is treated so as to decrease the adhesion of the edges 1210 of mask 1206, exposing an untextured portion 1212 of second surface 1204 adjacent to the blasted metal surface 1208. In this way, edges 1210 of mask 1206 adjacent to the textured 1208 first metal surface 1202 are lifted off the underlying second metal surface 1204. Treatment of the mask can include a chemical rinse using, for example, a dilute acid solution. Alternatively, a laser ablation procedure can be used to remove edges of the mask material. In some cases, edges of the mask may become naturally less adhesive to the metal surface during exposure to anodizing processes.

At 1108 (corresponding to FIG. 12D), a first anodizing process is performed creating a primary anodization layer 1214 on blasted metal surface 1208 and exposed untextured metal portion 1212. Primary anodization layer 1214 is hazy and does not clearly reveal the surface of underlying metal 1200. At 1110 (corresponding to FIG. 12E), mask 1206 is removed, exposing the remaining un-anodized second surface 1204. Second surface 1204 has retained any previously provided surface features such as artwork or reflectiveness. At 1112 (corresponding to FIG. 12F), a second anodizing process is performed creating a secondary anodization layer 1216 on a second surface 1204. Primary 1214 and secondary 1216 anodization layer can have different physical and microstructure properties. For example, secondary anodization layer 1216 can be substantially clear to reveal any features such as artwork or reflectiveness of the underlying metal 1200 while primary anodization layer 1214 can be substantially opaque. In this case, finished part 1218 has a textured surface 1208 with an opaque primary anodization layer 1214, an adjacent untextured portion 1220 which is opaque, and secondary anodization layer 1216 which is substantially transparent with an untextured surface 1222. Thus, visually, untextured surface 1220 can act as a highlight region or highlighted boundary that surrounds and defines secondary anodization layer 1216, which is transparent and reveals underlying metal 1200. It should be noted that although FIGS. 12A-12F illustrate a flat metal piece 1200, the highlighting methods described herein can be used on substrates with angled features, such as metal part shown in FIGS. 10B-10E. In these cases, methods provided herein can provide a consistent highlight along the edges of the part.

Use of Photomasks Having Pre-Distortion Features

As mentioned above, in some embodiments a photomask used to form the photoresist that covers artwork can include pre-distortion features in order to provide sharply defined corners in the resulting artwork. In general, a photomask is an opaque plate with holes or transparencies that allow light to shine through in a defined pattern. When the defined pattern of light shines on a layer of photoresist covering a substrate, the photoresist will take on the defined pattern. If a positive type photoresist is used, the portion of the photoresist that is exposed to light becomes soluble to the photoresist developer. The portion of the photoresist that is unexposed remains insoluble to the photoresist developer and remains on the surface of the substrate. If a negative type photoresist is used, the portion of the photoresist that is exposed to light becomes insoluble to the photoresist developer. The unexposed portion of the photoresist is dissolved by the photoresist developer.

Corner regions of the underlying photoresist tend to be overexposed or underexposed to light depending on whether the corner is an exterior corner or an interior corner. The underexposed or overexposed corner regions of the photoresist in turn result in these corner regions being underdeveloped or overdeveloped, respectively, in the photoresist developer. When the pattern is transferred onto the substrate, the corners will appear rounded and no longer sharp. In embodiments described herein, the photoresist can be exposed to not only a photolithography process, but also a blasting process and/or an anodizing process. The pre-distortion features in accordance with described embodiments can reduce the amount of corner rounding that can be caused by a photolithography process as well as a subsequent blasting and/or anodizing process.

In a blasting process, the photoresist, which is generally made of a relatively soft material, can be exposed to a physically harsh environment since the blasting media has abrasive particles applied under pressure. Corner regions of a pattern on the photoresist are especially susceptible to erosion from the blasting media, resulting in a pattern on the metal having rounded corners. It should be noted that in order to withstand the physically harsh environment of a blasting process, the photoresist is preferably relatively thick. Corner rounding can be further exacerbated if the photoresist is thick since it can be difficult for the light to penetrate though the entire thickness of the photoresist material. In addition, photoresist material generally becomes softer the thicker it is applied, thereby making it more vulnerable to damage from subsequent procedures such as blasting. After the photoresist is removed, the metal surface can then exposed to an anodizing process to form a protective anodization layer on the metal surface. If an anodizing procedure is used, the anodizing process can further round the appearance of the edge and corner features. This is because the anodizing process adds an additional layer onto the metal surface which can distort the appearance of and erode the sharpness of edges and corners of the pattern in the underlying metal surface.

In order to compensate for the above mentioned corner rounding effects, embodiments described herein include methods for providing a photomask with pre-distortion features at the corner regions of a photolithography pattern to provide a desired resultant pattern with sharply defined corners on the substrate. The pre-distortion regions on the photomask pattern appear as tapered portions extending from exterior corners and recessing within interior corners of the pattern.

Figures 13A, 13B:
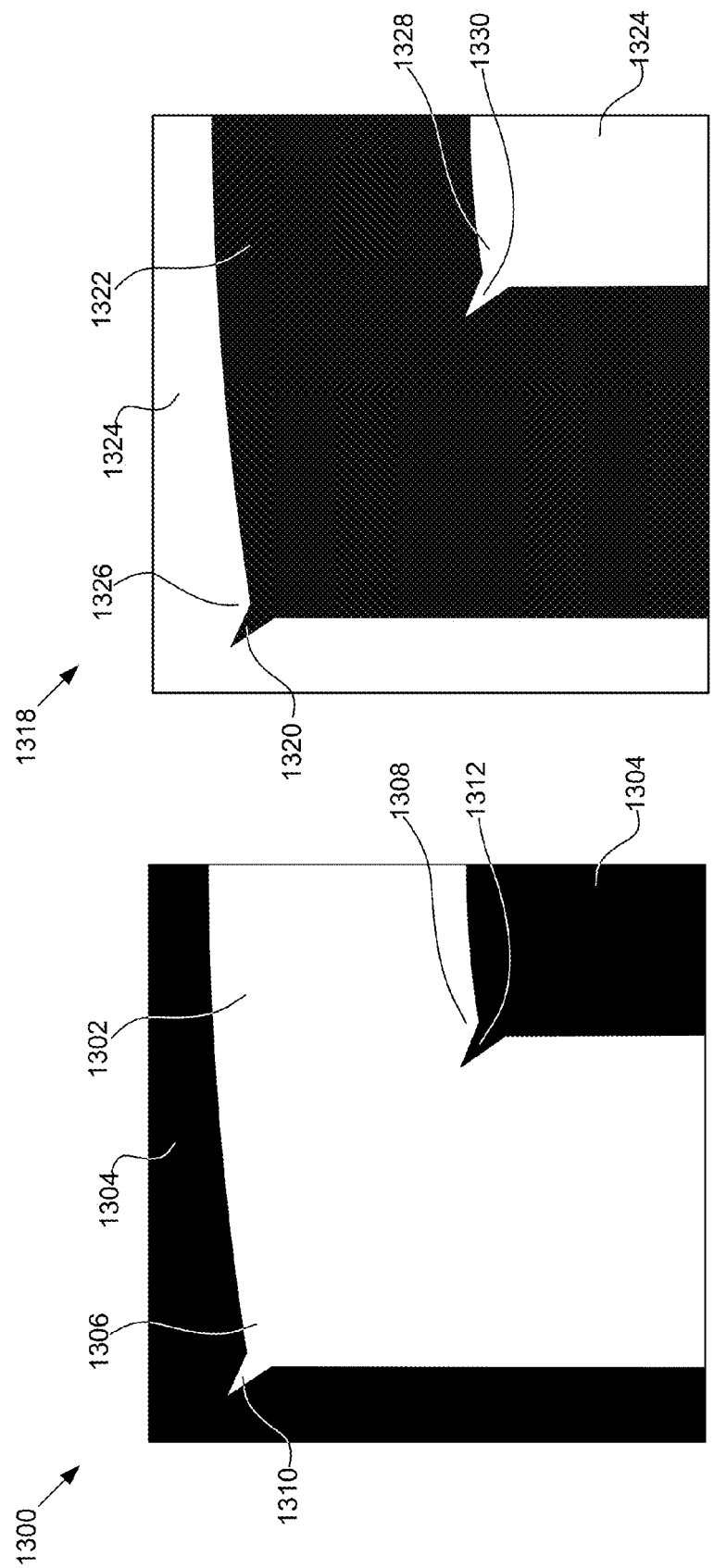
FIGS. 13A and 13B graphically illustrate close up views of selected portions of a photomask for developing negative type and positive type photoresist, respectively, in accordance with described embodiments.

FIGS. 13A-13B and 14A-14D depict close-up top-down views of photomask patterns and resultant corresponding photoresist patterns on substrates using photomasks having pre-distortion features in accordance with described embodiments. In FIG. 13A, photomask 1300 is configured for developing negative type photoresist. A pattern having opaque portion 1304 and transparent portion 1302 is disposed on photomask 1300. During the photolithography process, light is shone through transparent portion 1302 onto a layer of negative photoresist which is disposed on a substrate. The exposed portions of the negative photoresist corresponding to the transparent portion 1302 will remain on the substrate while unexposed portions of the negative photoresist corresponding to opaque portion 1304 will be dissolved and removed by the photoresist developer. As shown, transparent portion 1302 has extending pre-distortion feature 1310 positioned at exterior corner 1306 and receding pre-distortion feature 1312 at interior corner 1308. Extending pre-distortion feature 1310 compensates for the tendency of the underlying photoresist corresponding to exterior corner 1306 to be underexposed to light during the photolithography process and for degradation during subsequent blasting and/or anodizing processes. Thus, extending pre-distortion feature 1310 reduces the amount of corner erosion that can be caused by subsequent blasting and/or anodizing processes. Receding pre-distortion feature 1312 compensates for the tendency of the underlying photoresist corresponding to interior corner 1308 to be overexposed to light during the photolithography process and for degradation during subsequent blasting and/or anodizing processes. Thus, receding pre-distortion feature 1312 reduces the amount of corner erosion that can be caused by subsequent blasting and/or anodizing processes.

In FIG. 13B, photomask 1318 is configured for developing positive type photoresist. A pattern having opaque portion 1322 and transparent portion 1324 is disposed on photomask 1318. During the photolithography process, light is shone through transparent portion 1324 onto a layer of photoresist which is disposed on a substrate. The exposed portions of the positive photoresist corresponding to the transparent portion 1324 will be dissolved and removed by the photoresist developer while unexposed portions of the positive photoresist corresponding to opaque portion 1322 will remain on the substrate. As shown, transparent pattern 1324 has extending pre-distortion feature 1330 positioned at exterior corner 1328 and receding pre-distortion feature 1320 at interior corner 1326. Extending pre-distortion feature 1330 compensates for the tendency of the underlying photoresist corresponding to exterior corner 1328 to be underexposed to light during the photolithography process and for degradation during subsequent blasting and/or anodizing processes. Thus, extending pre-distortion feature 1330 reduces the amount of corner erosion that can be caused by subsequent blasting and/or anodizing processes. Receding pre-distortion feature 1320 compensates for the tendency of the underlying photoresist corresponding to interior corner 1326 to be overexposed to light during the photolithography process and for degradation during subsequent blasting and/or anodizing processes. Thus, receding pre-distortion feature 1320 reduces the amount of corner erosion that can be caused by subsequent blasting and/or anodizing processes.

FIGS. 14A-14D illustrate a photomask, photoresist and substrate at different stages of processing in accordance with described embodiments. In the embodiments depicted in 14A-14D, a negative type photoresist is used. It should be noted that methods described herein with respect to negative type photoresist can also be used for positive type photoresists. At FIG. 14A, photomask 1400 has opaque portion 1402 with transparent pattern 1404 formed therein. Transparent pattern 1404 has extending pre-distortion feature 1406 at exterior corners and recessing pre-distortion feature 1408 at interior corners. FIG. 14B, shows substrate 1410 after a photolithography process has been performed using photomask 1400. In a photolithography process, a UV light is shone through the transparent pattern 1404 to form a corresponding pattern on a photoresist that has been spun onto an underlying substrate. It should be noted that since the photoresist will undergo a subsequent blasting process, the photoresist material is preferably applied on to a relatively thick layer. In some embodiments, the photoresist is between about 40 to 50 microns thick. The photoresist is then developed to remove unexposed portions of the photoresist, leaving patterned photoresist 1414 and exposed substrate portion 1412. As shown in the inset view, portions of the extending 1406 and receding 1408 pre-distortion features from the transferred pattern of photomask 1400 have been rounded by the time the pattern was transferred to photoresist 1414. This corner rounding is caused by optical effects of the photolithography process wherein corner regions in a photomask pattern tend to be underexposed and overexposed during a photolithography process, as described above. As a result, patterned photoresist 1414 has a first photoresist feature 1416 at outside corners and a second photoresist feature 1418 at inside corners. First photoresist feature 1416 and second photoresist feature 1418 of the photoresist are rounded and less pronounced as the extending 1406 and receding 1408 pre-distortion feature of photomask 1400.

FIG. 14C shows substrate 1410 after undergoing a blasting process. As mentioned above, a blasting process involves the use of an abrasive material that impinges upon the substrate at a certain pressure in order to achieve a textured surface on portions of the substrate unprotected by photoresist. In one embodiment, the blasting media takes the form of zirconia applied under pressure. Since photoresist material is generally relatively soft, some of the photoresist material can be displaced and removed by the impinging particles during the blasting process, especially at exterior corners of the photoresist layer, resulting in rounded protruding corners. At interior corners of the photoresist layer, blobs of photoresist can form due to the displacement and dislodgment of photoresist material, resulting in rounded interior corners. If the photoresist material is too thin, blasting can form holes in the photoresist material which can lead to damage to underlying portions of the substrate. However, if the photoresist layer is too thick, the entire thickness of the photoresist may not be sufficiently exposed to UV light during the photolithography process, thereby further exacerbating the rounding effects described above. Optimized thicknesses of photoresist can depend upon a number of factors such as the type of photoresist material used and UV wavelengths and intensities used. It is noted than any suitable photoresist material that can withstand a photolithography process, a blasting process and/or an anodization process can be used. The photoresist can be applied on the substrate using any suitable technique, such as a spray coating or spin on operation.

Returning to FIG. 14C, after substrate 1420 is exposed to a blasting process, resultant substrate 1420 has textured portion 1422 and patterned photoresist 1424 which protects an underlying portion of substrate. As shown in the inset view, portions of first photoresist feature 1416 and second photoresist feature 1418 prior to blasting have been eroded by the blasting media. As a result, patterned photoresist 1424 has first photoresist feature 1426 at exterior corners and second photoresist feature 1428 at interior corners, respectively, which are rounded and less pronounced compared to first photoresist feature 1416 and second photoresist feature 1418 of the photoresist prior to the blasting process.

FIG. 14D shows substrate 1420 after photoresist 1424 has been removed and the metal surface has undergoing an anodizing process. As mentioned above, an anodizing process can further round or distort the sharpness of corners since an anodization layer adds a layer of material over the substrate. In FIG. 14D, after substrate 1420 is exposed to an anodization process, resultant substrate 1430 has textured anodized portion 1432 and untextured anodized portion 1434. As shown in the inset view, untextured anodized portion 1434 has sharply defined exterior corner 1436 and sharply defined interior corner 1438. If protruding and indenting corners of photomask 1400 did not have the extending 1406 and receding 1408 pre-distortion features, the resulting photoresist 1434 after photolithography, blasting and anodizing processes would be rounded and less aesthetically appealing. Thus, the extending 1406 and receding 1408 pre-distortion features in photomask 1400 compensate for corner erosion that occurs caused by the subsequent blasting process experienced by photoresist 1424 and further for corner rounding caused by the subsequent anodizing process.

Figure 14E:
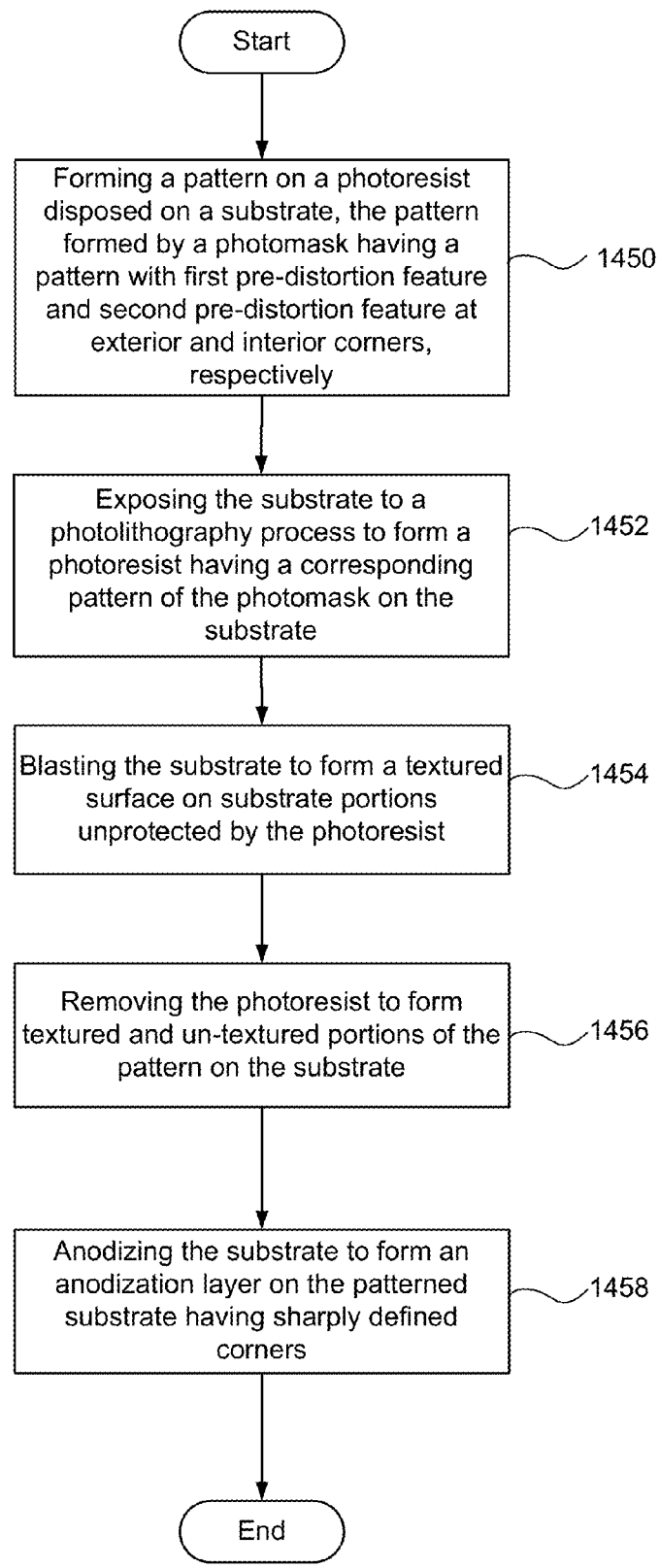
FIG. 14E is a flow chart illustrating details of process for forming a pattern on a substrate using a photomask with pre-distortion features in accordance with described embodiments.

FIG. 14E is a flow chart illustrating details of a process for forming a pattern on a substrate using a photomask with pre-distortion features in accordance with described embodiments. At 1450, a pattern is formed on a photoresist disposed on a substrate, the pattern formed by a photomask having a pattern with a first pre-distortion feature and/or a second pre-distortion feature at exterior and/or interior corners, respectively. As described above, the first pre-distortion feature extends from the exterior corners and the second pre-distortion feature recedes within the interior corners. At 1452, the substrate is exposed to a photolithography process to form a photoresist having a corresponding pattern of the photomask on the substrate. At 1454, the substrate undergoes a blasting process to form a textured surface on portions of the substrate that are unprotected by the photoresist. Next at 1456, the photoresist is removed to form a pattern on the substrate having textured and un-textured portions. At 1458, the substrate undergoes an anodizing process to form an anodized layer on the textured and un-textured pattern. The resultant anodized and blasted surface will have sharply defined and aesthetically appealing corners.

Molding Techniques for Anodizing Resistant Components

As discussed above, certain structural portions of an electronic device can be formed from plastic or resin materials in accordance with described embodiments. The plastic portions can be configured to withstand exposure to harsh manufacturing processes and chemicals, such as those encountered during an anodizing process. As described below, the plastic structural portions can be integrated into the housing of an electronic device using a two-shot molding process. FIGS. 15A-15B and 16 show several illustrative views of an electronic device which include plastic portions in accordance with some embodiments. FIGS. 15A-15B show outer periphery component 100 that can be constructed by connecting several sections together, such as sections 110, 120, and 130. In some embodiments, outer periphery component 100 can be constructed by connecting section 110 and section 120 together at interface 112, and connecting section 120 and section 130 together at interface 122. To mechanically couple individual sections together, coupling members 114 and 124 can exist at interfaces 112 and 122, respectively. Coupling members 114 and 124 can be constructed from an injection molding process wherein the plastic that begins in a first, liquid state and then subsequently changes to a second, solid state. Upon changing into the solid state, the plastic material can then bond together sections 110 and 120, and 120 and 130, respectively, thus forming a single new component (e.g., outer periphery component 100). Coupling members 114 and 124 can not only physically couple together sections 110 and 120, and 120 and 130, respectively, they can also electrically isolate section 110 from section 120, and section 120 from section 130.

Coupling members 114 and 124 can exist with integrally formed locking structures that are attached to or integrally formed with parts of sections 110, 120, and 130. A shutoff device (not shown) may be positioned at each interface to shape the coupling member for when it transforms into its second state (e.g., the solid state). Coupling members 114 and 124 are constructed to span a width of outer periphery member 100, as shown. A portion of the coupling members 114 can interface with locking members 141-155 existing on the sidewalls of sections 110, 120, and 130, and other portions of members 114 and 124 can interface with additional locking members existing on the edge of the sections. When coupling member 114 is applied in a liquid state, it flows into and/or around locking members 141-155, and as it turns into a solid, it forms a physical interconnect that couples sections 110 and 120 together. Coupling member 114 can include screw inserts that line up with holes in section 110 so that screws or other fastener can be used to secure section 110 to member 114.

Coupling members 114 and 124 may be machined, for example, after it is applied as a first shot, so as to have holes, recesses, retention features, or any other desired features. Some machined features are illustratively as elements 161-167. For example, elements 161-163 are holes, and elements 165-167 are rectangular cutouts. These machine features can enable cables to pass from one side of the coupling member to another or to enable secure placement of various components such as a button, a camera, a microphone, a speaker, an audio jack, a receiver, a connector assembly, or the like. Coupling members 114 and 124 can be constructed to include a first shot component and a second shot component. The first and second shot components can be composed of different materials, wherein the first shot is composed of a relatively higher strength structural material than the second shot material. The first shot component can be responsible for the physical coupling of the sections (e.g., section 110 to section 120) and can be machined to include retaining regions for receiving the second shot.

The first shot can be formed by an injection molding process wherein the plastic begins in a first liquid state and subsequently changes to a second solid state. While in the liquid state, the plastic can be allowed to flow into interfaces 112 and 122 and in locking members 141-155. After flowing into the interfaces locking members, the plastic material can subsequently be allowed to harden (e.g., the plastic material is allowed to change into the second solid state). The second shot component can serve as a cosmetic component that is self-anchored within the retaining region of the first shot. The second shot can be formed by injection molding the plastic onto at least a portion of the surface of the first shot component. The second shot can be formed within cavities of the first shot that serve as mechanical interlocks that physically couple the first and second shots together. After flowing into portions of the first shot, the plastic material can subsequently be allowed to harden. In certain embodiments, the second shot is only formed on portions of the surface of the first shot that would otherwise be visible from the outside of the electronic device. In these cases, the second shot can be the only part that is visible to the user when the device is fully assembled. In some embodiments, the second shot is formed to take up as little space as possible in the device while still providing adequate coverage for cosmetic purposes. In some embodiments, the second shot completely surrounds and protects the first shot. In some cases the second shot can be as thin as a veneer which can partially or completely surrounds the surface of the first shot.

During the injection molding process, while in liquid state, the second shot is allowed to flow into and/or around locking structures formed within the first shot component. The second shot can have any suitable color. As shown in FIGS. 15A-15B, coupling members 114 and 124 are shown to include first shot component 430 and second shot component 440. First shot component 430 includes interface features for interfacing with locking mechanisms of sections 120 and 130. First shot component 430 can also include second shot retention regions for receiving second shot components 440. FIG. 16 shows a close up view of sections 110 and 120 with second shot component 440 disposed there between. In some embodiments, second shot component 440 is visible and first shot component 430 is not visible from the exterior of the component 100.

Coupling members 114 and 124 can be exposed to various physically and chemically harsh environments during the manufacturing process. For example, the side walls and back plate of an electronic device can undergo polishing or lapping operations, which can involve the use of very acidic (e.g., around pH 2) and/or very alkali (e.g., around pH 8-9) slurries depending on whether the polishing is a fine or a rough polishing procedure. In addition, during photolithograph, the device can be exposed to UV light during UV curing stage and developing stage, as well as exposure to a strong base such as sodium hydroxide for rinsing away non-cured photoresist material. Furthermore, during an anodizing process, the device can be subjected to a variety of acidic and alkali solutions at elevated temperatures and for extended amounts of time, as described above with reference to anodizing techniques. If a blasting procedure is used, the plastic material can be exposed to a pressurized blasting media. In one embodiment, the blasting media takes the form of zirconia applied under about 1 bar of pressure. Additionally, during de-masking (used to remove photoresist material) the device can be exposed to acidic or alkali rinses solutions at elevated temperatures. Moreover, during a CNC the device can be exposed to cutting fluids. The first shot and second shot materials can be unaffected by one or more of the above described processes in that they can maintain structural integrity and can appear substantially unmarred. It should be noted that in some embodiments a mask can be used to prevent degradation of portions of plastic during some of the processes described above. For example, a mask can be used to protect plastic during higher intensity UV exposure during photolithography and during certain CNC steps to protect the plastic surface from scratching. Any suitable mask to protect the plastic can be used. In one embodiment, a UV curable polymer mask is used.

In embodiments described herein the plastic materials used for fabricating portions, such as coupling members 114 and 124, can be configured to withstand the physical and chemical conditions of one or more of the above described processes. The first and second shot can be made of different materials to serve different purposes. In some embodiments, the first shot can be made of a stronger material so as to provide structural support for the electronic device and the second shot can be made of a softer but more cosmetically appealing material for aesthetic purposes. In certain embodiments, both the first shot and second shot materials are configured to withstand the physical and chemical conditions of one or more of the above described processes. In embodiments where the second shot completely surrounds the first shot, the second shot can be resistant to one or more of the above described processes while the first shot is not necessarily resistant to one or more of the above described processes. That is, the second shot can protect the surface of the first shot from the subsequent processes. In one embodiment, the first shot material is made of a high mechanical strength thermoplastic polymer resin such as a glass filled polyaryletherketone (PAEK) material. In other embodiments a glass filled polyethylene terephthalate (PET) material is used. In preferred embodiments, the second shot appears as smooth and even, thereby providing a more cosmetically appealing appearance than the first shot. In some cases, the second shot can take on one of more colors.

Figure 17:
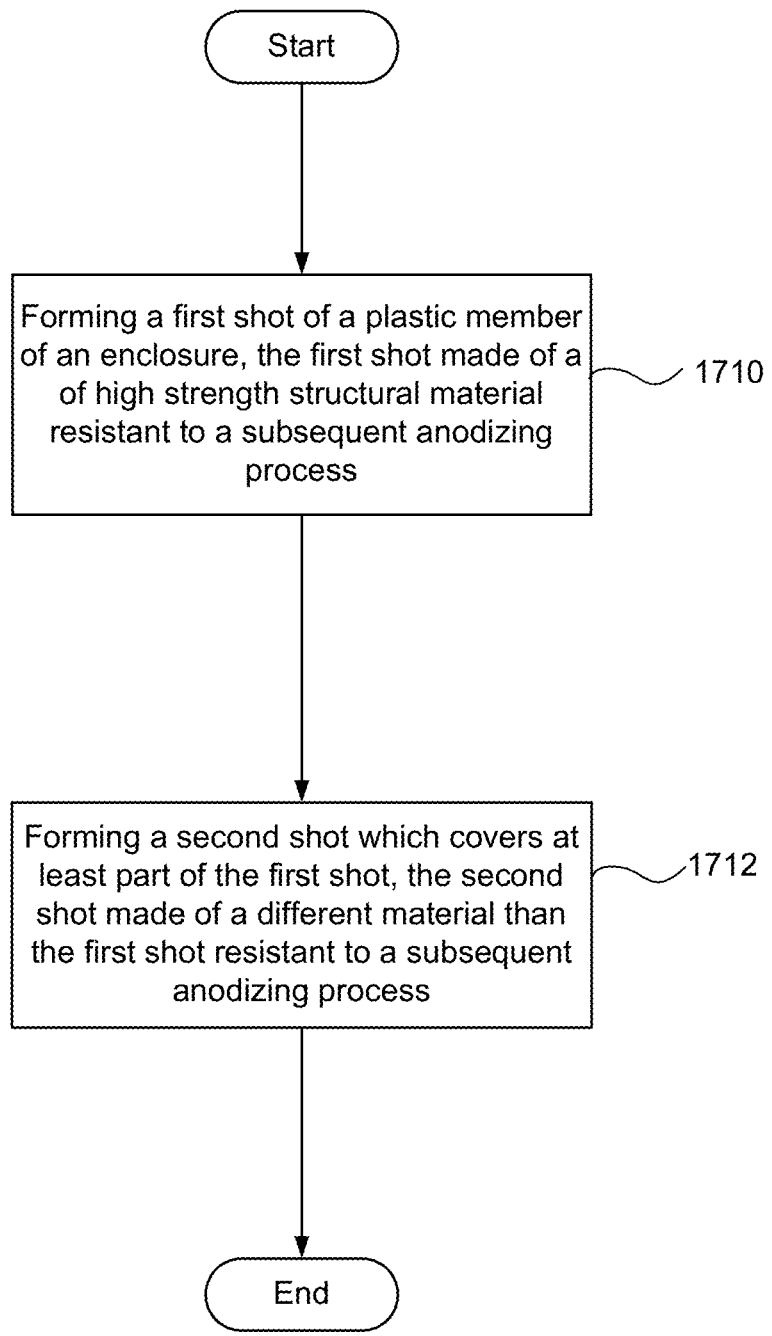
FIG. 17 is a flow chart illustrating details of a process for forming an anodizing resistant plastic member for an enclosure in accordance with described embodiments.

FIG. 17 is a flowchart illustrating details of process for forming a two-shot plastic member for an enclosure that is resistant to an anodizing process in accordance with described embodiments. At 1710, a first shot component of a plastic member of an enclosure is formed, the first shot component being made of a high strength structural material that is resistant to a subsequent anodizing process. At 1720, a second shot component of the plastic member of an enclosure is formed, the second shot component formed to cover at least part of the surface of the first shot component. The second shot component material is made of a different material than the first shot component and is resistant to a subsequent anodizing process. As described above, in some embodiments, the first shot and second shot material can be resistant to a subsequent process such as polishing, UV photolithography, blasting de-masking or CNC process. The first and second shot components can be formed by injection molding process, as described above, wherein they are each in a first liquid state and harden to a second solid state.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A consumer electronic product, comprising:
    a housing having a bottom portion defining a first surface and a side wall defining a second surface, the first surface non-parallel to the second surface, wherein the first surface and second surface meet at a chamfered edge, the chamfered edge defining a chamfer surface disposed between the first surface and the second surface, wherein the first surface and the second surface are textured surfaces and the chamfer surface is a mirror reflective surface;
    a primary anodization layer disposed on the first surface and the second surface; and
    a secondary anodization layer disposed on the chamfer surface.

2. The consumer electronic product as recited in claim 1, wherein the first surface and second surface are blasted surfaces.

3. The consumer electronic product as recited in claim 2, wherein the secondary anodization layer has a different pore density than the primary anodization layer.

4. The consumer electronic product as recited in claim 3, wherein secondary anodization layer has a different average pore size than the primary anodization layer.

5. The consumer electronic product as recited in claim 4, wherein the primary anodization layer includes a first portion and a second portion, wherein a first angle between an edge of the first portion and the secondary anodization layer is about equal to a second angle between an edge of the second portion and the secondary anodization layer.

6. The consumer electronic product as recited in claim 1, wherein a thickness of the primary anodization layer is about the same as a thickness of the secondary anodization layer.

7. The consumer electronic product as recited in claim 1, wherein the secondary anodization layer is characterized as having a first pore density and a first average pore size and wherein the primary anodization layer is characterized as having a second pore density and a second average pore size.

8. The consumer electronic product as recited in claim 7, wherein the first pore density is greater than the second pore density and the first average pore size is less than the second average pore size.

9. A housing for a consumer electronic product, the housing comprising:
    a protective coating covering a chamfered edge of the housing, the chamfered edge comprising a chamfer surface positioned between a first surface and a second surface, wherein the first surface and the second surface are textured surfaces and the chamfer surface is a mirror reflective surface; the first surface non-parallel to the second surface, the protective coating comprising:
        a primary anodization layer covering the first surface and the second surface, and
        a secondary anodization layer covering the chamfer surface.

10. The housing of claim 9, wherein a difference in a thickness of the primary anodization layer and a thickness of the secondary anodization layer is about 5 microns or less.

11. The housing of claim 9, wherein the first surface and the second surface are characterized as blasted surfaces and the chamfer surface is a polished surface.

12. The housing of claim 9, wherein the chamfered edge includes a highlighted portion, the highlighted portion characterized as a polished surface portion of at least one of the first surface or the second surface.

13. The housing of claim 9, wherein the secondary anodization layer has a different pore density than the primary anodization layer.

* * * * *